(12) United States Patent
Gautam et al.

(10) Patent No.: US 11,004,525 B1
(45) Date of Patent: May 11, 2021

(54) MODULATION OF PROGRAMMING VOLTAGE DURING CYCLING

(71) Applicant: SANDISK TECHNOLOGIES LLC, Addison, TX (US)

(72) Inventors: Rajdeep Gautam, Yokohama (JP); Ken Oowada, Yokohama (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/796,897

(22) Filed: Feb. 20, 2020

(51) Int. Cl.
| | |
|---|---|
| *G11C 16/34* | (2006.01) |
| *G11C 16/04* | (2006.01) |
| *G11C 16/10* | (2006.01) |
| *G11C 16/14* | (2006.01) |
| *H01L 27/11556* | (2017.01) |
| *H01L 27/11582* | (2017.01) |
| *H01L 27/11565* | (2017.01) |
| *H01L 27/11519* | (2017.01) |

(52) U.S. Cl.
CPC ...... *G11C 16/3495* (2013.01); *G11C 16/0483* (2013.01); *G11C 16/10* (2013.01); *G11C 16/14* (2013.01); *G11C 16/3459* (2013.01); *H01L 27/11556* (2013.01); *H01L 27/11582* (2013.01); *H01L 27/11519* (2013.01); *H01L 27/11565* (2013.01)

(58) Field of Classification Search
CPC ..... G11C 16/0483; G11C 16/10; G11C 16/14; G11C 16/3459; G11C 16/3495; H01L 27/11556; H01L 27/11582; H01L 27/11565
USPC .......................... 365/185.24, 185.28, 185.33
See application file for complete search history.

(56) References Cited

U.S. PATENT DOCUMENTS

| | | | |
|---|---|---|---|
| 7,558,109 B2 | 7/2009 | Brandman | |
| 8,045,392 B2* | 10/2011 | Nazarian | ............ G11C 16/0483 365/185.22 |
| 10,424,387 B1* | 9/2019 | Zhang | ................. G11C 11/5671 |
| 10,740,476 B2 | 8/2020 | Shappir | |

(Continued)

OTHER PUBLICATIONS

Gautam, et al., "Modulation of Programming Voltage During Cycling," U.S. Appl. No. 16/914,408, filed Jun. 28, 2020.

(Continued)

*Primary Examiner* — Son L Mai
(74) *Attorney, Agent, or Firm* — Vierra Magen Marcus LLP

(57) ABSTRACT

Systems and methods for increasing cycling endurance and minimizing over programming of non-volatile memory cells by modulating the programming voltage applied to the non-volatile memory cells over time as the number of program/erase cycles increases are described. A bit count ratio based on bit counts within two threshold voltage zones may be used to determine the amount of voltage reduction in the programming voltage applied during subsequent programming operations. For example, if the bit count ratio is between 0.02 and 0.05, then the reduction in the programming voltage may be 100 mV; if the bit count ratio is between 0.05 and 0.10, then the reduction in the programming voltage may be 200 mV. The modulation (e.g., the reduction) of the programming voltage may be performed at varying cycle intervals depending on the total number of program/erase cycles for a memory block and/or the bit count ratio.

20 Claims, 18 Drawing Sheets

(56) References Cited

U.S. PATENT DOCUMENTS

2009/0168524 A1   7/2009  Golov et al.
2011/0131367 A1   6/2011  Park et al.

OTHER PUBLICATIONS

Notice of Allowance dated Mar. 26, 2021, U.S. Appl. No. 16/914,408.

* cited by examiner

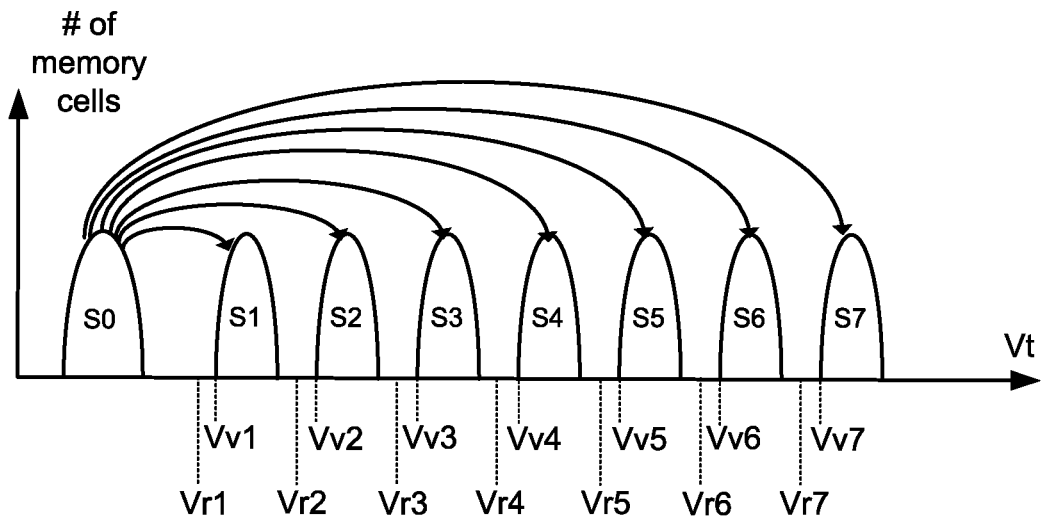
FIG. 5
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |
FIG. 6A
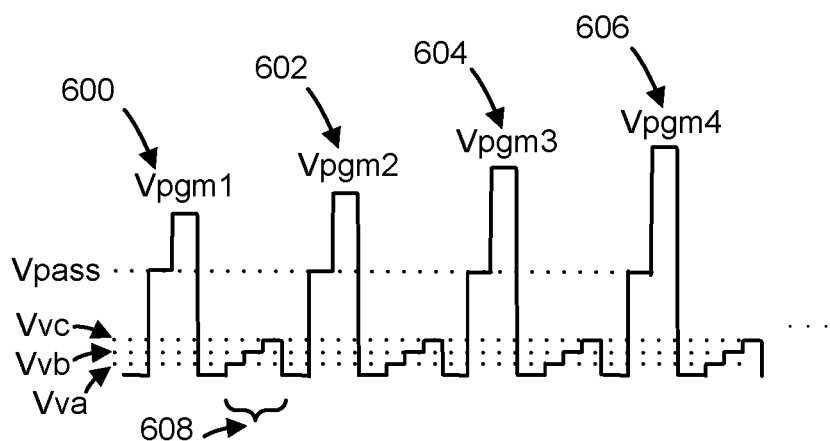
FIG. 6B

Bit Count Ratio (BCR) = Zone-2 / [Zone-1+Zone-2]

|   | BCR Value | VPGM Adjustment |
|---|---|---|
| 1 | 0.02 (2% rise) | -0.1V |
| 2 | 0.05 (5% rise) | -0.2V |
| 3 | 0.1 (10% rise) | -0.3V |
| 4 | 0.15 (15% rise) | -0.4V |
| 5 | 0.2 (20% rise) | -0.5V |
| 6 | 0.25 (25% rise) | -0.6V |

| Number of WE Cycles | BCR Value | VPGM Adjustment |
|---|---|---|
| 0-100KWE | 0.02 (2% rise) | -0.1V |
| 100KWE-200KWE | 0.02 (2% rise) | -0.2V |
| > 200KWE | 0.02 (2% rise) | -0.3V |
| 0-100KWE | 0.10 (10% rise) | -0.2V |
| 100KWE-200KWE | 0.10 (10% rise) | -0.4V |
| > 200KWE | 0.10 (10% rise) | -0.6V |

FIG. 7G

Bit Count Ratio (BCR) = Zone-2 / [Zone-1+Zone-2]

| | BCR Value | WE interval |
|---|---|---|
| 1 | 0.02 (2% rise) | 10000 WE |
| 2 | 0.05 (5% rise) | 8500 WE |
| 3 | 0.1 (10% rise) | 7000 WE |
| 4 | 0.15 (15% rise) | 5500 WE |
| 5 | 0.2 (20% rise) | 4000 WE |
| 6 | 0.25 (25% rise) | 2000 WE |
| 7 | 0.27 (27% rise) | 1600 WE |

MODULATION OF PROGRAMMING VOLTAGE DURING CYCLING

BACKGROUND

The growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives (SSDs).

Semiconductor memory devices may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM). Both flash memory and EEPROM typically utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim (F-N) tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

BRIEF DESCRIPTION OF THE DRAWINGS

Like-numbered elements refer to common components in the different figures.

FIG. 5 depicts threshold voltage distributions.

FIG. 6A is a table describing one example of an assignment of data values to data states.

FIG. 6B depicts one embodiment of a series of program and verify pulses which are applied to a selected word line during a programming operation.

FIG. 7G depicts one embodiment of a table for calculating the programming voltage adjustment based on a bit count ratio and the number of write/erase cycles experienced by a set of memory cells or a memory block.

FIG. 7H depicts one embodiment of a table for calculating the programming voltage adjustment interval (or WE interval) based on a bit count ratio.

DETAILED DESCRIPTION

Figure 1:
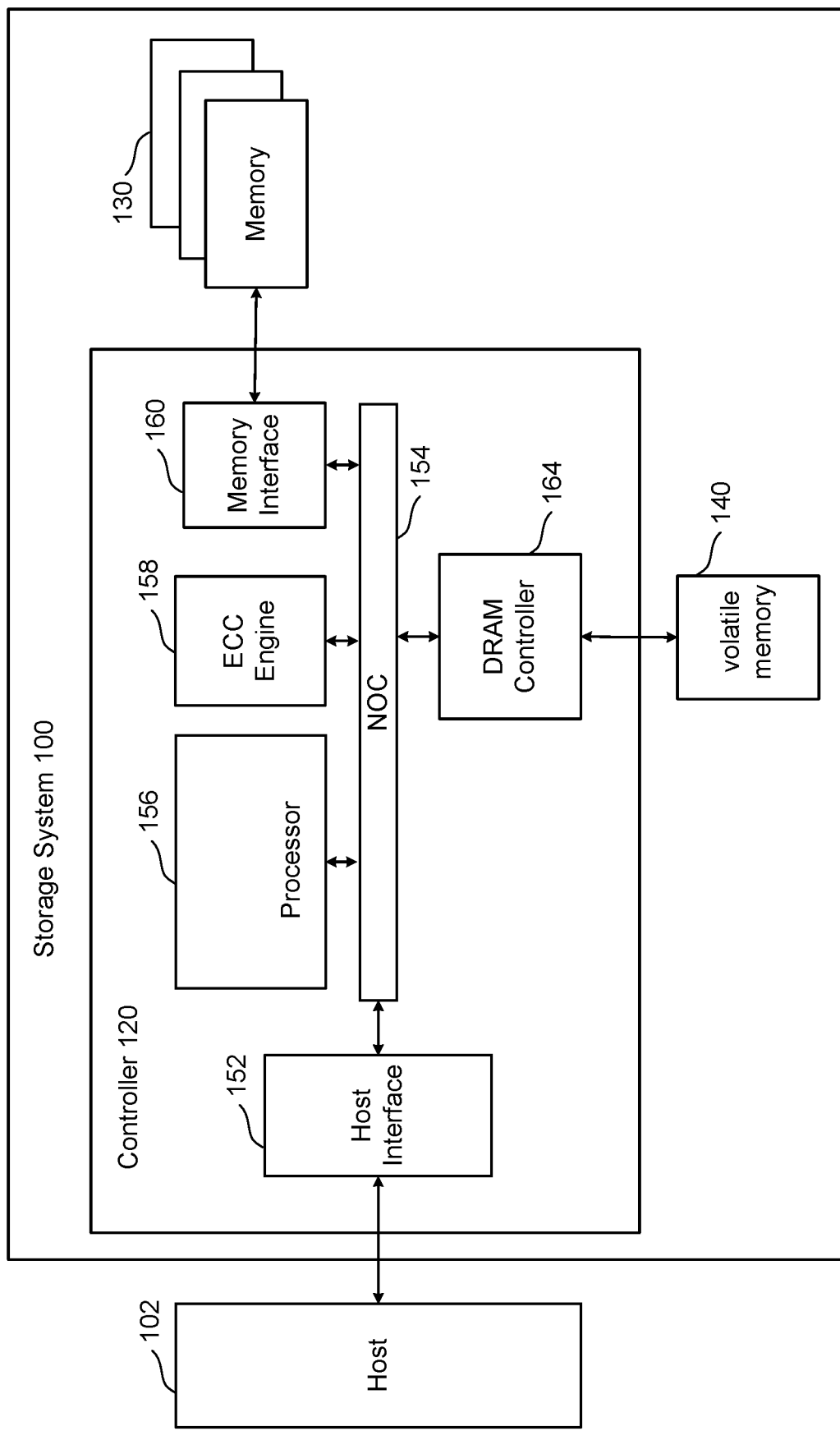
FIG. 1 is a block diagram depicting one embodiment of a memory system.

Technology is described for increasing cycling endurance and minimizing over programming of non-volatile memory cells by modulating the programming voltage applied to the non-volatile memory cells over time as the number of program/erase cycles increases. The non-volatile memory cells may correspond with floating gate transistors or charge trap transistors. The non-volatile memory cells may be part of a memory block that includes one or more NAND strings. In some cases, a bit count ratio based on bit counts within two threshold voltage zones may be used to determine the amount of voltage reduction in the programming voltage applied during subsequent programming operations. The bit counts within the two threshold voltage zones may be determined using two or more verify levels (e.g., two verify levels at the upper tail of a particular threshold voltage distribution corresponding with the B-state). A first bit count may correspond with the number of memory cells within a particular threshold voltage distribution with threshold voltages between a first verify level (e.g., 1.7V) and a second verify level (e.g., 1.9V) greater than the first verify level. A second bit count may correspond with the number of memory cells within the particular threshold voltage distribution with threshold voltages greater than the second verify level. A bit count ratio may comprise the second bit count divided by the sum of the first bit count and the second bit count. In one example, if the bit count ratio is between 0.02 and 0.05, then the reduction in the programming voltage may be 100 mV; if the bit count ratio is between 0.05 and 0.10, then the reduction in the programming voltage may be 200 mV.

In some embodiments, the modulation (e.g., the reduction) of the programming voltage may be performed at varying cycle intervals depending on the total number of program/erase cycles for a memory block and/or the bit count ratio. For example, if the number of program/erase cycles experienced by a memory block is between 50K and 100K cycles and the bit count ratio is less than 0.02, then the cycle interval for modulation of the programming voltage may be set to 10K cycles; however, if the number of program/erase cycles experienced by the memory block is greater than 100K cycles or the bit count ratio is greater than 0.1, then the cycle interval for modulation of the programming voltage may be set to 5K cycles. The frequency or resolution at which the programming voltage is modulated may be increased as the number of program/erase cycles increases. For example, if the number of program/erase cycles experienced by a memory block is less than 100K cycles, then the update frequency may correspond with 10K program/erase cycles; however, if the number of program/erase cycles experienced by the memory block is greater than 100K cycles, then the update frequency may correspond with 5K program/erase cycles.

One technical issue with achieving a high number of endurance cycles (e.g., over 500K program/erase cycles) is that stress induced memory cell over programming may lead to an increase or widening in memory cell threshold voltage distributions and an increase in the number of bit errors. The widening in the memory cell threshold voltage distributions may reduce read voltage margin and require a higher read voltage in order to open the NAND string channel during read operations. One benefit of adaptively reducing the programming voltage applied to non-volatile memory cells over time as the number of program/erase cycles increases is that memory cell over programming may be minimized which may allow maintenance of a lower read voltage margin at a higher number of endurance cycles. Moreover, the ability to use a lower read voltage may lead to reduced power consumption during read operations.

In some embodiments, a plurality of programming voltages for programming a plurality of data states may be individually adjusted depending on bit count ratios for the threshold voltage distributions for the plurality of data states. In one example, the bit count ratio for a B-state that is centered around a threshold voltage of 1.5V may be calculated by determining a first number of memory cells with threshold voltages between 1.6V and 1.65V, determining a second number of memory cells with threshold voltages between 1.65V and 1.7V, and calculating the bit count ratio for the B-state distribution as the second number divided by the sum of the first number and the second number. In some cases, if the bit count ratio exceeds a threshold ratio (e.g., exceeds 0.20), then the verify voltage levels for determining the bit count ratio may be increased (e.g., by 100 mV). After the increase in the verify voltage levels, the first number of memory cells may correspond with memory cells with threshold voltages between 1.7V and 1.75V and the second number of memory cells may correspond with memory cells with threshold voltages between 1.75V and 1.8V.

In some embodiments, if a bit count ratio exceeds a threshold ratio (e.g., exceeds 0.25), then a new threshold voltage zone may be created towards the upper tail of the threshold voltage distribution and a new bit count ratio may be calculated based on the number of bits within the new threshold voltage zone. If the new bit count ratio exceeds the threshold ratio, then the frequency at which the programming voltages are adjusted may be increased. For example, if the new bit count ratio exceeds 0.20, then the number of cycles between updates to the programming voltages may be reduced from every 10K program/erase cycles to every 5K program/erase cycles.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 1-2 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may comprise various memory structures including planar NAND structures, vertical NAND structures, Bit Cost Scalable (BiCS) NAND structures, 3D NAND structures, or 3D ReRAM structures.

FIG. 1 is a block diagram of one embodiment of a memory system 100 that implements the proposed technology, including countermeasures for avoiding unrecoverable errors due to over programming. In one embodiment, storage system 100 is a solid state drive ("SSD"). Memory system 100 can also be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 120 connected to one or more memory die 130 and local high speed volatile memory 140 (e.g., DRAM). The one or more memory die 130 each comprise a plurality of non-volatile memory cells. More information about the structure of each memory die 130 is provided below. Local high speed volatile memory 140 is used by controller 120 to perform certain functions. For example, local high speed volatile memory 140 stores logical to physical address translation tables ("L2P tables").

Controller 120 comprises a host interface 152 that is connected to and in communication with host 102. In one embodiment, host interface 152 provides a PCIe interface. Other interfaces can also be used, such as SCSI, SATA, etc.

Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, as well as memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, the controller (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with one or more memory die 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2:
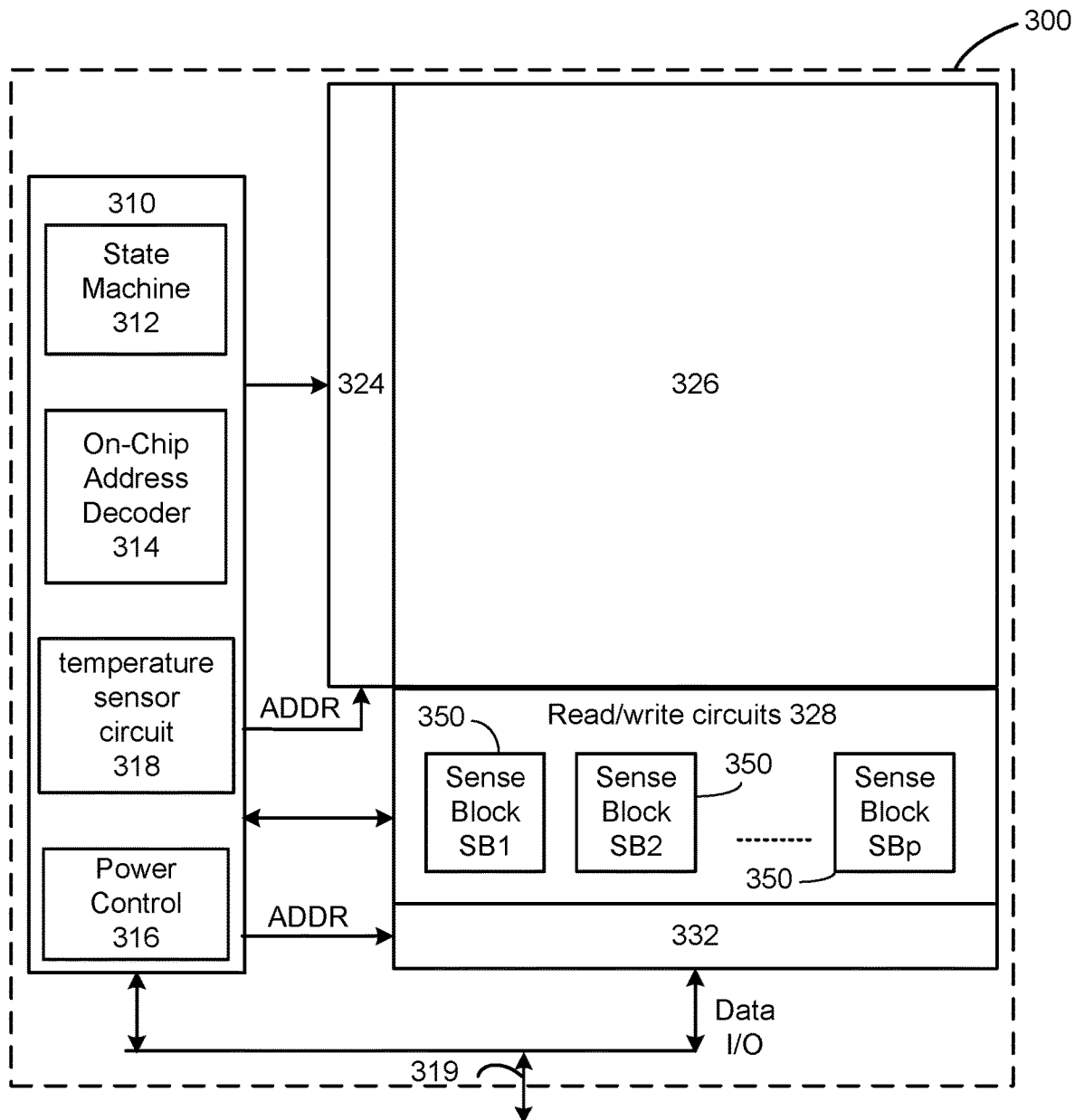
FIG. 2 is a block diagram of one embodiment of a memory die.

FIG. 2 is a functional block diagram of one embodiment of a memory die 300. Each of the one or more memory die 130 of FIG. 1 can be implemented as memory die 300 of FIG. 2. The components depicted in FIG. 2 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, SBp (sensing circuitry) and allow a page (or multiple pages) of data in multiple memory cells to be read or programmed (written) in parallel. In one embodiment, each sense block include a sense amplifier and a set of latches connected to the bit line. The latches store data to be written and/or data that has been read. The sense amplifiers include bit line drivers. Commands and data are transferred between the controller and the memory die 300 via lines 319. In one embodiment, memory die 300 includes a set of input and/or output (I/O) pins that connect to lines 118.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature sensor circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a programmable microcontroller or microprocessor. In one embodiment, control circuitry 310 includes buffers such as registers, ROM fuses and other storage devices for storing default values such as base voltages and other parameters. Temperature sensor circuit 318 detects current temperature at memory die 300.

In some embodiments, one or more of the components (alone or in combination) within the memory die 300 may be referred to as a managing or control circuit. For example, one or more managing or control circuits may include any one of or a combination of control circuitry 310, state machine 312, decoder 314, power control 316, sense blocks 350, or read/write circuits 328. The one or more managing circuits or the one or more control circuits may perform or facilitate one or more memory array operations including erasing, programming, or reading operations.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, read/write circuits 328 and decoders 324/332 comprise one embodiment of a control circuit for memory structure 326. In other embodiments, other circuits that support and operate on memory structure 326 can be referred to as a control circuit. For example, in some embodiments, the controller can operate as the control circuit or can be part of the control circuit. In some embodiments, the controller in combination with control circuitry 310, read/write circuits 328 and decoders 324/332 comprise one embodiment of a control circuit. In another embodiment, state machine 312 comprises the control circuit. In another embodiment, the host can provide the control circuit.

In one embodiment, memory structure 326 comprises a monolithic three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. A NAND string includes memory cells connected by a channel.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ferroelectric memories (FeRAM or FeFET), ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a Ge2Sb2Te5 alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
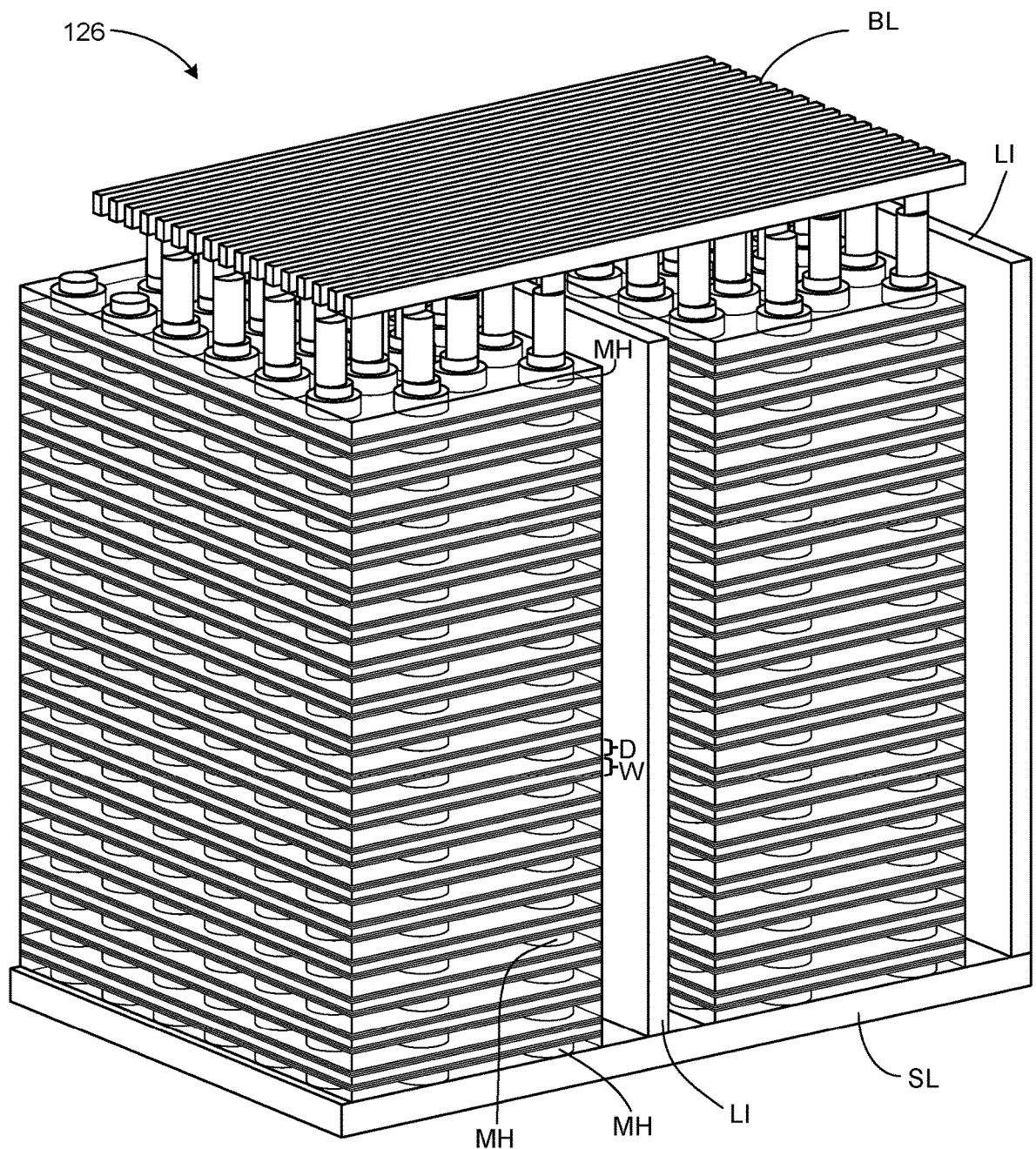
FIG. 3 is a perspective view of a portion of one embodiment of a monolithic three dimensional memory structure.

FIG. 3 is a perspective view of a portion of one example embodiment of a monolithic three dimensional memory array that can comprise memory structure 326, which includes a plurality non-volatile memory cells arranged as vertical NAND strings. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects LI. FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 126 is provided below with respect to FIG. 4A-4F.

Figure 4A:
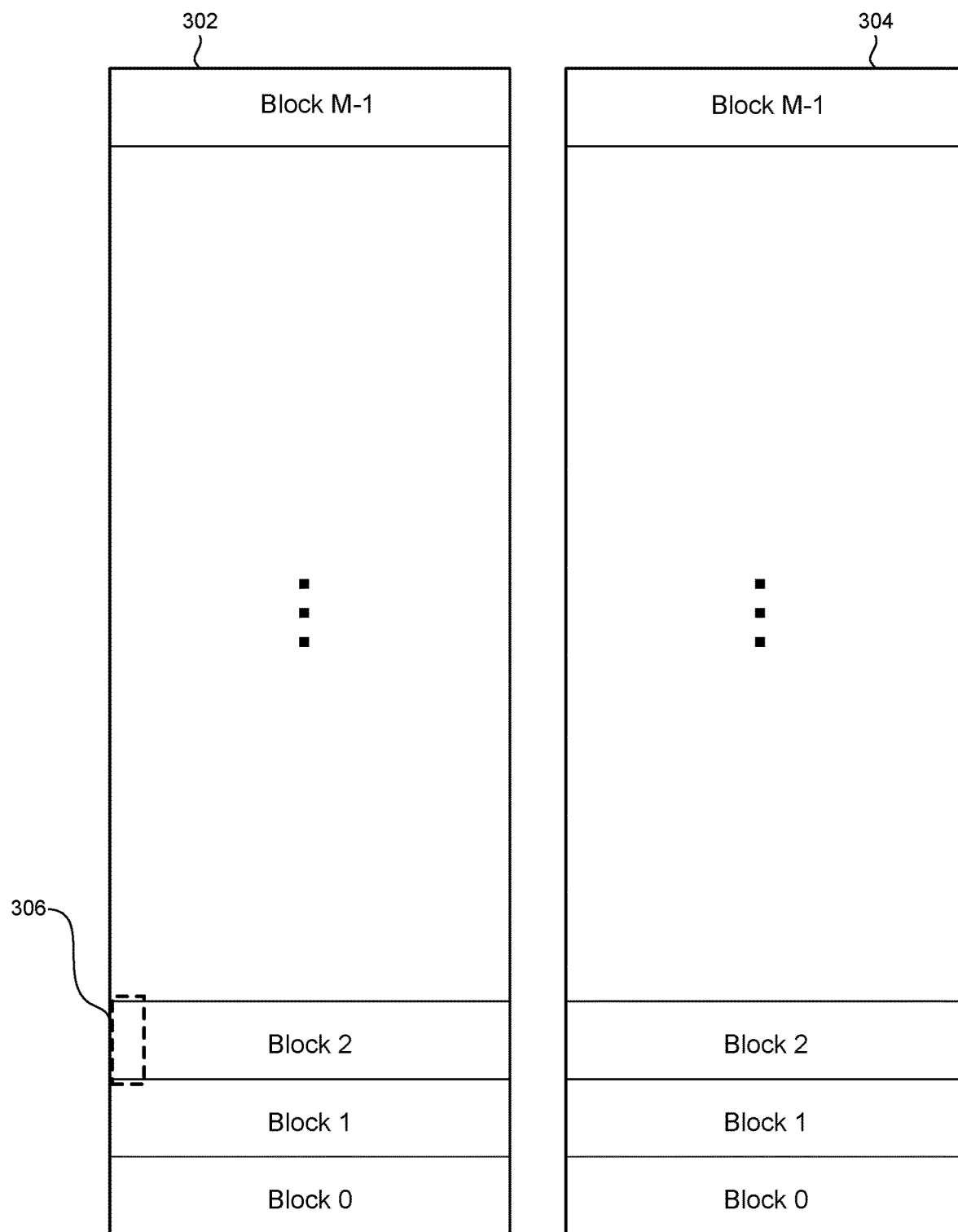
FIG. 4A is a block diagram of a memory structure having two planes.

FIG. 4A is a block diagram explaining one example organization of memory structure 326, which is divided into two planes 302 and 304. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of word lines. In some embodiments, a memory block may comprise a group of memory cells that are erased together or that share a common well connection.

Figure 4B:
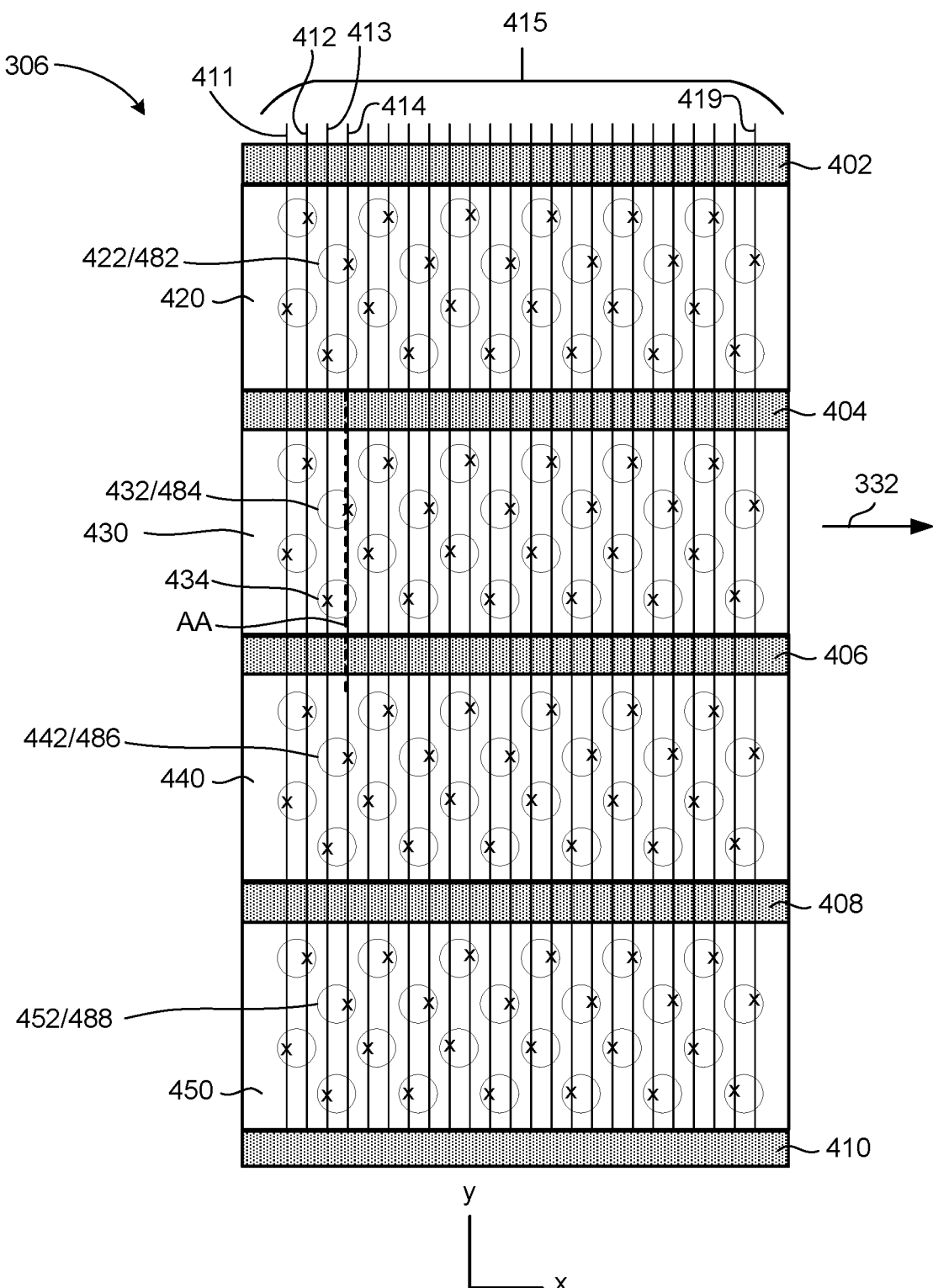
FIG. 4B depicts a top view of a portion of a block of memory cells.

FIGS. 4B-4F depict an example three dimensional ("3D") NAND structure that corresponds to the structure of FIG. 3 and can be used to implement memory structure 326 of FIG. 2. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
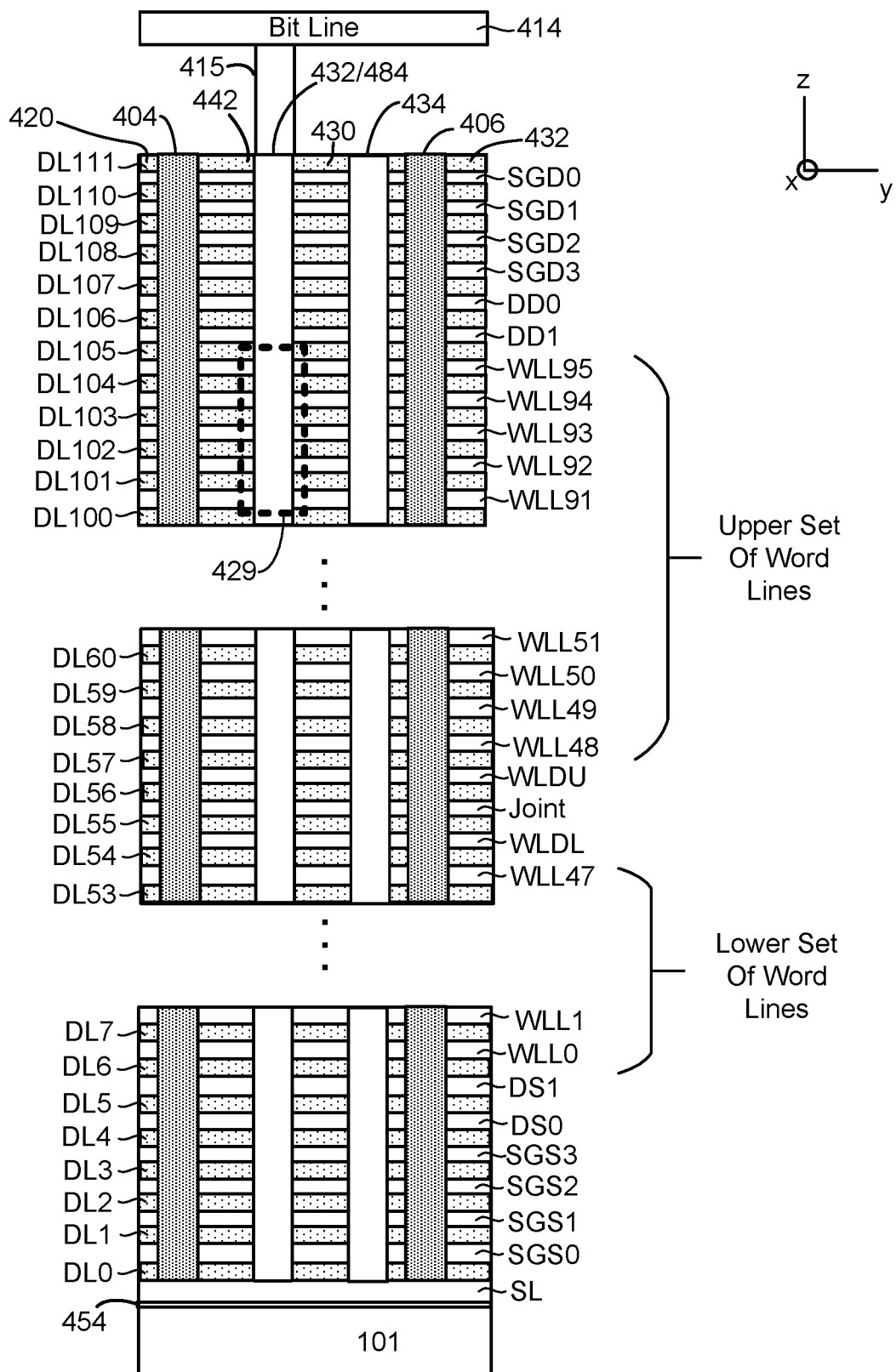
FIG. 4C depicts a cross sectional view of a portion of a block of memory cells.

FIG. 4C depicts a portion of one embodiment of a three dimensional memory structure 326 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety six data word line layers WLL0-WLL95 for connecting to data memory cells. Other embodiments can implement more or less than four drain side select layers, more or less than four source side select layers, more or less than six dummy word line layers, and more or less than ninety six word lines. Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL95 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL111. For example, dielectric layers DL104 is above word line layer WLL94 and below word line layer WLL95. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a Joint area. In one embodiment it is expensive and/or challenging to etch ninety six word line layers intermixed with dielectric layers. To ease this burden, one embodiment includes laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect to the first stack to the second stack. In FIG. 4C, the first stack is labeled as the "Lower Set of Word Lines" and the second stack is labeled as the "Upper Set of Word Lines." In one embodiment, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
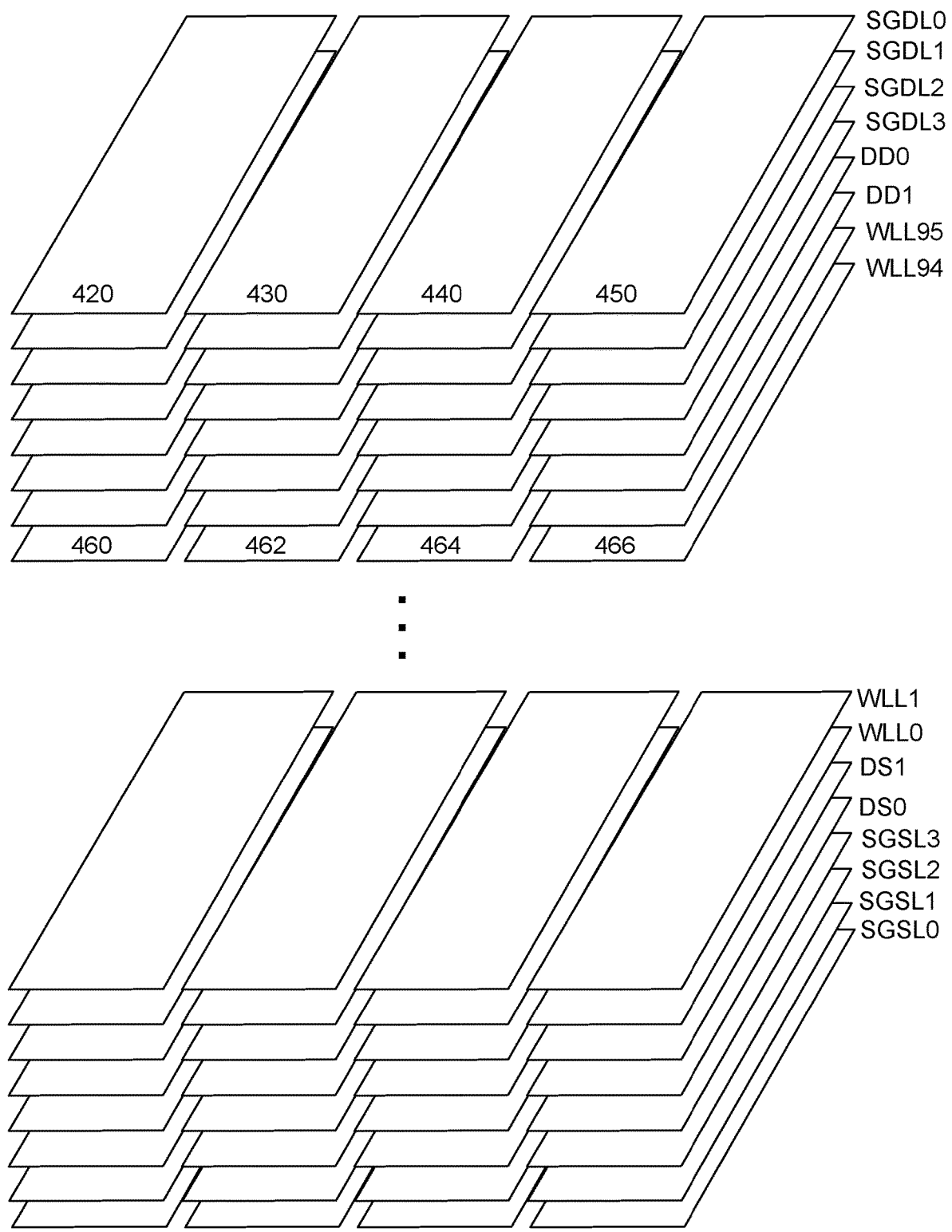
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL95) for the block that is partially depicted in FIG. 4C. As mentioned above with respect to FIG. 4B, in one embodiment local interconnects 402, 404, 406, 408 and 410 break up the conductive layers into four regions/fingers (or sub-blocks). For example, word line layer WLL94 is divided into regions 460, 462, 464 and 466. For word line layers (WLL0-WLL127), the regions are referred to as word line fingers; for example, word line layer WLL126 is divided into word line fingers 460, 462, 464 and 466. For example, region 460 is one word line finger on one word line layer. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
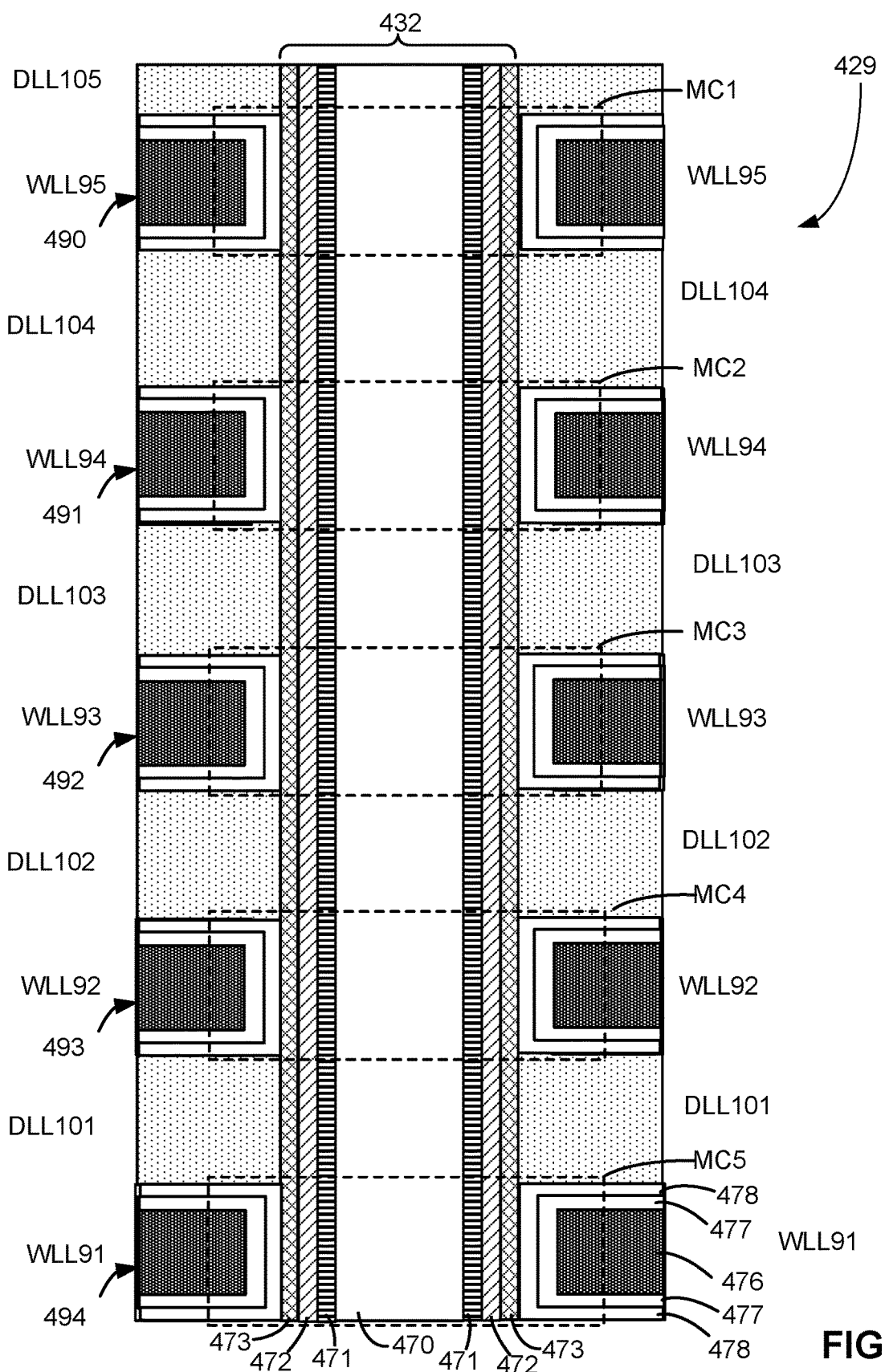
FIG. 4E is a cross sectional view of a vertical column of memory cells.

FIG. 4E depicts a cross sectional view of region 429 of FIG. 4C that includes a portion of vertical column 432 (a memory hole). In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
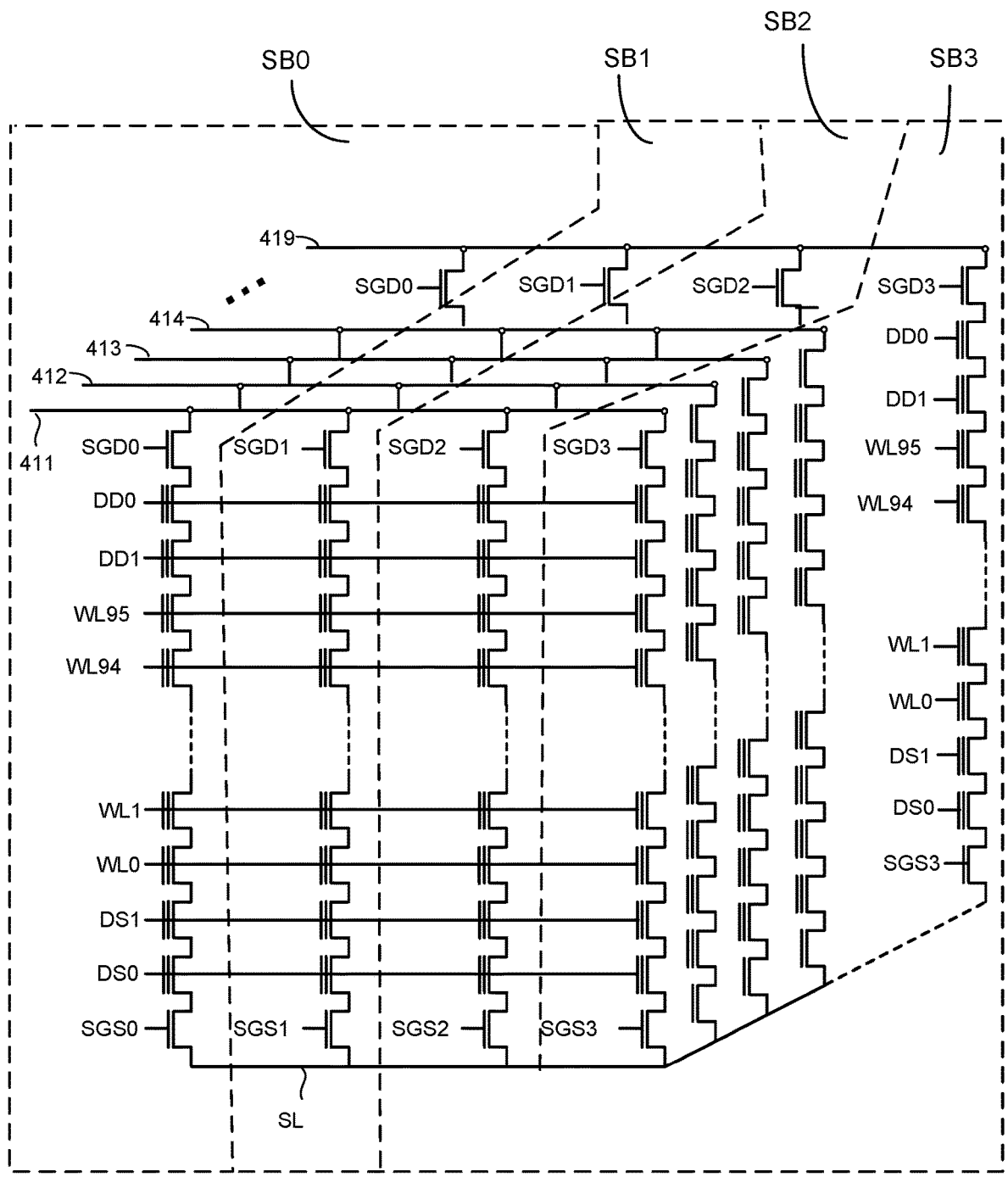
FIG. 4F is a schematic of a plurality of NAND strings showing multiple sub-blocks.

FIG. 4F is a schematic diagram of a portion of the memory depicted in in FIGS. 3-4E. FIG. 4F shows physical word lines WLL0-WLL95 running across the entire block. The structure of FIG. 4F corresponds to portion 306 in Block 2 of FIGS. 4A-E, including bit lines 411, 412, 413, 414, . . . . 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 3-4F is a three dimensional memory structure that includes vertical NAND strings with charge-trapping material, other (2D and 3D) memory structures can also be used with the technology described herein.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed states or programmed data states. In some embodiments, data states S1-S7 can overlap, with controller 122 relying on error correction to identify the correct data being stored.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming including (but not limited to) multiple stage/phase programming.

Each threshold voltage distribution (data state) of FIG. 5 corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 6A is a table describing one example of an assignment of data values to data states. In the table of FIG. 6A, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5) or verify operation (e.g. see verify reference voltages Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

As discussed above, it is possible that memory cells can become over programmed. For example, consider the example of a memory cell intended to be programmed to data state S4. The programming process is designed to increase the threshold voltage of the memory cell from the threshold voltage distribution for data state S0 to data S4 by applying a programming signal as a set of programming pulses that increase in magnitude by a step size and testing between program pulses as to whether the memory cell's threshold voltage has reached Vv4. However, due to a structural variation or increase in programming speed due to program/erase cycling, it is possible that when the memory cell's threshold voltage has reached Vv4 it has also surpassed Vr5, which may lead to an error when reading the memory cell later. This is one example of over programming. If a small number of memory cells become over programmed, the ECC process during reading may be able to correct the errors. However, if too many memory cells are over programmed or have errors, then the ECC may not be able to correct all of the errors and the reading process may fail, resulting in loss of data.

To prevent loss of data, it is proposed that the non-volatile storage system include a mechanism to compensate for over programming during the programming process. That is, after the programming process starts for a set of data and target memory cells and prior to the programming process completing for the set of data and the target memory cells, the system determines whether there is more than a threshold number of over programmed memory cells and, if so, then the system adjusts the programming process mid-way through the programming process (e.g., in-flight) to compensate for the over programming that has occurred so far in the currently being performed programming process.

FIG. 6B depicts one embodiment of a series of program and verify pulses which are applied to a selected word line during a programming operation. A programming operation may include multiple program-verify iterations, where each iteration applies one or more programming pulses followed by one or more verify pulses (e.g., to verify or determine the programming state or the programming level of a memory cell) to a selected word line. In one embodiment, the programming pulses are stepped up in successive iterations. Moreover, each programming pulse may include a first portion which has a pass voltage (Vpass) level, e.g., 6-8 V, followed by a second, highest amplitude portion at a programming voltage (Vpgm) level, e.g., 12-25 V. For example, as depicted in FIG. 6B, a first, second, third, and fourth programming pulses 800, 802, 804 and 806 have programming voltage levels of Vpgm1, Vpgm2, Vpgm3 and Vpgm4, respectively. One or more verify voltages 808, such as verify voltages Vva, Vvb and Vvc, may be provided after each programming pulse. In some cases, one or more initial programming pulses are not followed by verify pulses because it is not expected that any storage elements could have reached the lowest program state (e.g., A-state). Subsequently, in some cases, programming iterations may use verify pulses for the A-state, followed by programming iterations which use verify pulses for the A-states and B-states, followed by programming iterations which use verify pulses for the B-states and C-states.

Figure 6C:
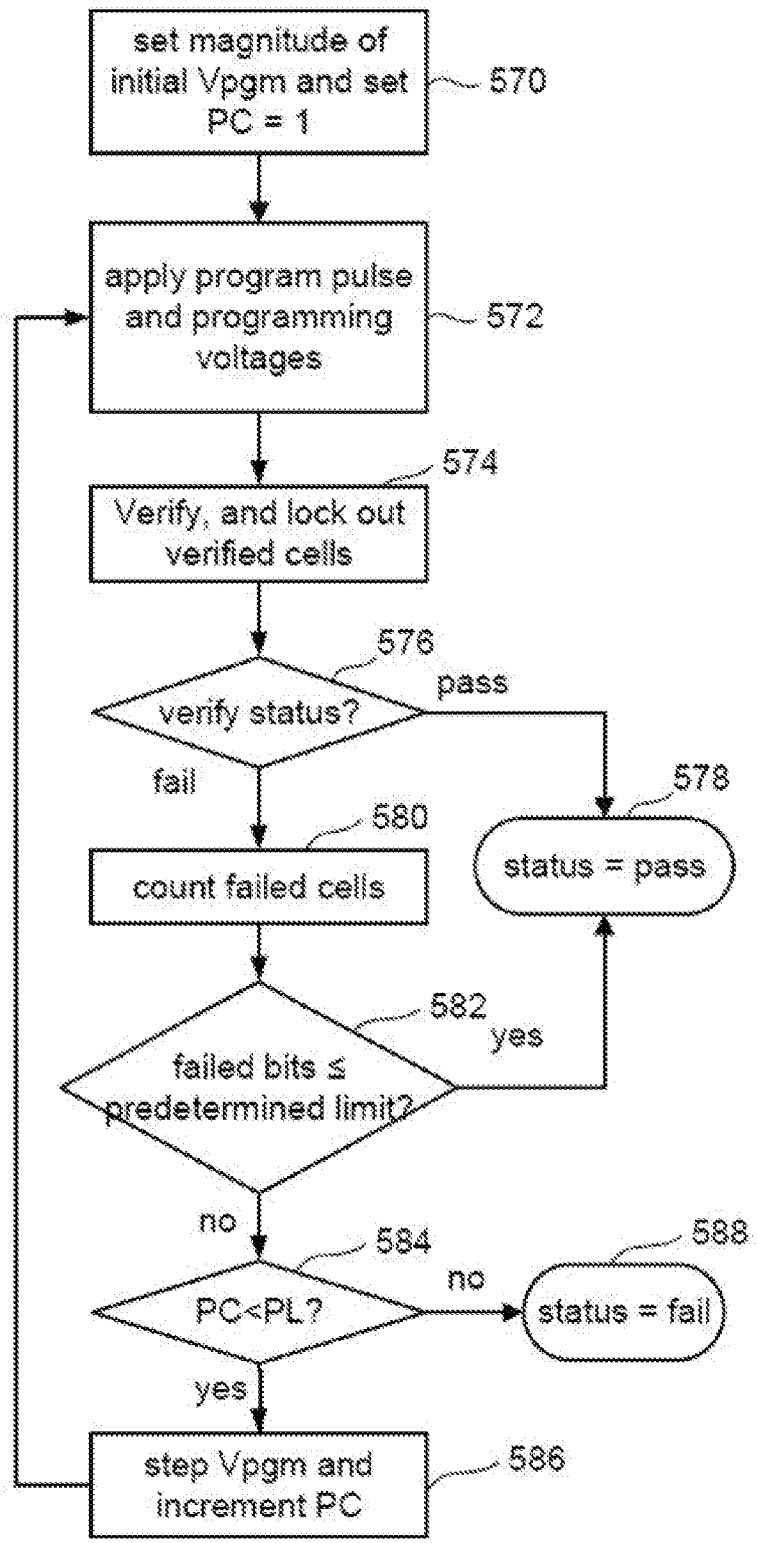
FIG. 6C is a flowchart describing one embodiment of a process for programming that is performed by a memory die.

FIG. 6C is a flowchart describing one embodiment of a process for programming that is performed by a memory die, such as memory die 300 in FIG. 2. In one example embodiment, the process of FIG. 6C is performed on memory die 300 using a control circuit at the direction of state machine 312 in FIG. 2. The process of FIG. 6C may be performed to implement the full sequence programming of FIG. 5, as well as other programming schemes including multi-stage programming. When implementing multi-stage programming, the process of FIG. 6C may be used to implement any/each stage of the multi-stage programming process.

Typically, the program voltage applied to the control gates (via a selected word line) during a program operation is applied as a series of program pulses (voltage pulses). Between programming pulses are a set of verify pulses to perform verification. In many implementations, the magnitude of the program pulses is increased with each successive pulse by a predetermined step size. In step 570 of FIG. 6C, the programming voltage (Vpgm) is initialized to the starting magnitude (e.g., ~12-16V or another suitable level) and a program counter PC maintained by state machine 312 is initialized at 1. In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. In one embodiment, if a memory cell should be programmed, then the corresponding bit line is grounded. On the other hand, if the memory cell should remain at its current threshold voltage, then the corresponding bit line is connected to Vdd to inhibit programming. In step 572, the program pulse is concurrently applied to all memory cells connected to the selected word line so that all of the memory cells connected to the selected word line are programmed concurrently. That is, they are programmed at the same time or during overlapping times (both of which are considered concurrent). In this manner, all of the memory cells connected to the selected word line will concurrently have their threshold voltage change, unless they have been locked out from programming.

In step 574, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 576, it is determined whether all the memory cells have reached their target threshold voltages (pass). If so, the programming process is complete and successful because all selected memory cells were programmed and verified to their target states. A status of "PASS" (or success) is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of memory cells that have, so far, failed the verify process. This counting can be done by the state machine 312, the controller 120, or other logic. In one implementation, each of the sense blocks will store the status (pass/fail) of their respective memory cells. In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is a number of bits that can be corrected by error correction codes (ECC) during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to one or more thresholds in step 582.

In one embodiment, the predetermined limit can be less than the total number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 584 and the program counter PC is checked against the program limit value (PL). Examples of program limit values include 6, 20 and 30; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line so that another iteration (steps 572-586) of the programming process of FIG. 7 is performed.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In one embodiment, programming serves to raise the threshold voltage of the memory cells to one of the programmed data states S1-S7 depicted in FIG. 5. Erasing serves to lower the threshold voltage of the memory cells to the Erase data state S0.

One technique to erase memory cells in some memory devices is to bias a p-well to a high voltage to charge up a NAND channel. An erase enable voltage is applied to control gates of memory cells while the NAND channel is at a high voltage to erase the non-volatile storage elements (memory cells). Another approach to erasing memory cells is to generate gate induced drain leakage (GIDL) current to charge up the NAND string channel. An erase enable voltage is applied to control gates of the memory cells, while maintaining the string channel potential to erase the memory cells.

Figure 7A:
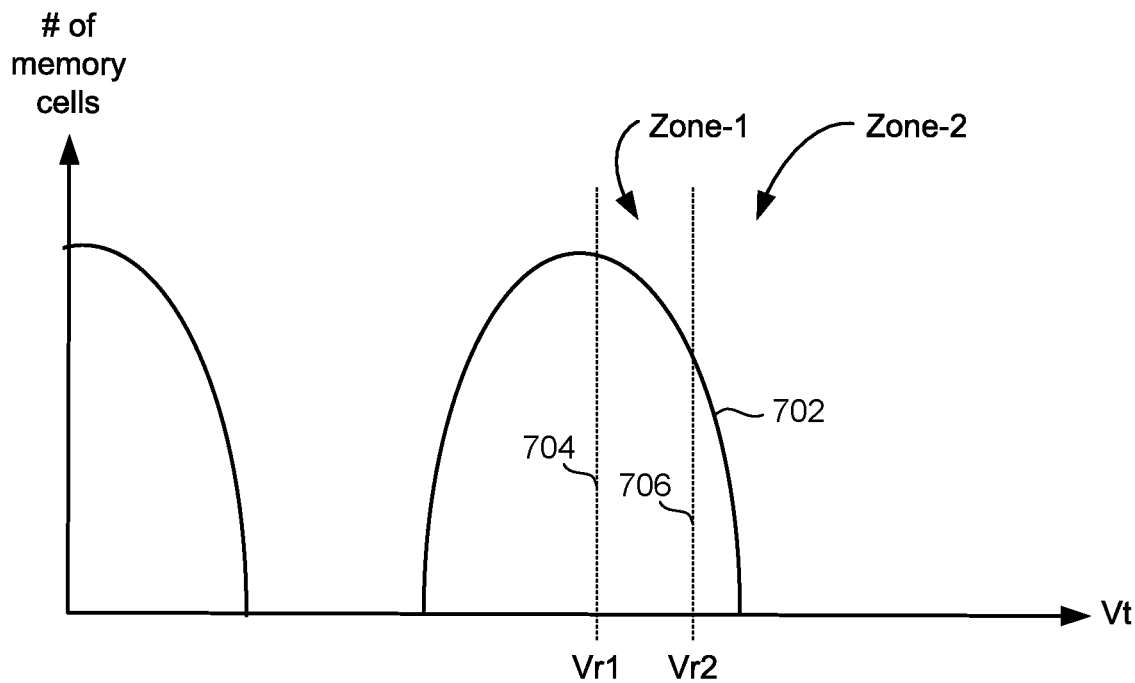
FIG. 7A depicts one embodiment of a threshold voltage distribution for a particular data state.

FIG. 7A depicts one embodiment of a threshold voltage distribution 702 for a particular data state (e.g., the B-state or the D-state) and the read voltages Vr1 704 and Vr2 706 for identifying two bit counts corresponding with two threshold voltage zones Zone-1 and Zone-2. In one example, the threshold voltage distribution 702 may correspond with data state S1 in FIG. 5. Referring to FIG. 5, the data state S0 may correspond with an erased data state, data state S1 may correspond with an A-state, data state S2 may correspond with a B-state, data state S3 may correspond with a C-state, and data state S4 may correspond with a D-state. Typically, the number of memory cells with threshold voltages within the higher zone will be less than the number of memory cells with threshold voltages within the lower zone.

After a memory block has been through a threshold number of program/erase cycles (e.g., after 10K program/erase cycles), then a bit count ratio corresponding with two threshold voltage zones may be calculated and used to determine whether a programming voltage for the particular data state should be reduced. To determine the bit count ratio, a first number of bits or a first number of memory cells assigned to the particular data state with a threshold voltage between the read voltages Vr1 704 and Vr2 706 may be determined, a second number of bits or a second number of memory cells assigned to the particular data state with a threshold voltage greater than the read voltage Vr2 706 may be determined, and then the second number of bits may be divided by the sum of the first number of bits and the second number of bits in order to calculate the bit count ratio.

In some embodiments, the number of bits for zone Zone-2 at a first point in time may be calculated and stored and then compared with the number of bits for zone Zone-2 at a second point in time subsequent to the first point in time in order to detect the growth in the number of bits within the zone Zone-2. The first point in time may correspond with a memory block after it has experienced only 10K program/erase cycles and the second point in time may correspond with the memory block after it has experienced 20K program/erase cycles. If the growth in the number of bits within zone Zone-2 after 10K program/erase cycles has increased more than 50%, then the programming voltage for programming cells to the particular data state may be reduced. The amount of voltage reduction in the programming voltage for programming cells to the particular data state may be determined via a lookup table, such as the table depicted in FIG. 7D.

Figure 7B:
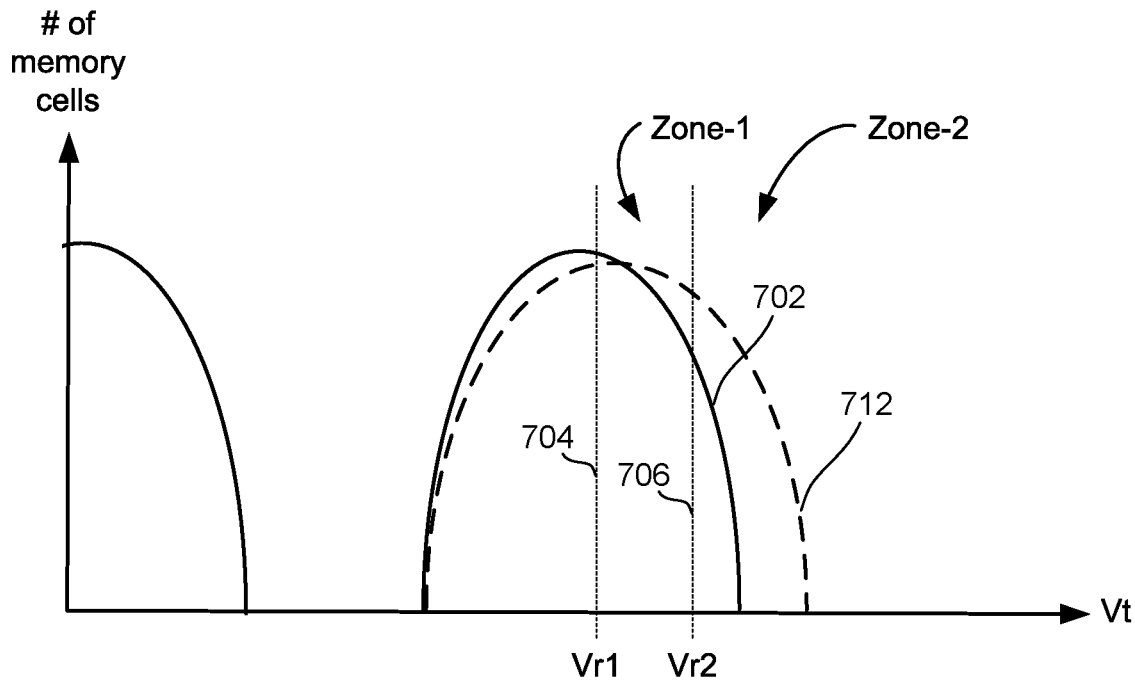
FIG. 7B depicts one embodiment of a threshold voltage distribution for the particular data state depicted in FIG. 7A and the read voltages for identifying two bit counts corresponding with two threshold voltage zones.

FIG. 7B depicts one embodiment of a threshold voltage distribution 712 for the particular data state depicted in FIG. 7A and the read voltages Vr1 704 and Vr2 706 for identifying two bit counts corresponding with two threshold voltage zones Zone-1 and Zone-2. The threshold voltage distribution 702 may correspond with memory cells that have experienced a first number of program/erase cycles and the threshold voltage distribution 712 may correspond with memory cells that have experienced a second number of program/erase cycles greater than the first number of program/erase cycles. In one example, the first number of program/erase cycles may comprise 10K program/erase cycles (or write/erase WE cycles) and the second number of program/erase cycles may comprise 20K program/erase cycles. After a number of program/erase cycles have been performed, the upper tail of the threshold voltage distribution for the particular data state may shift higher; in this case, the upper tail of the threshold voltage distribution 712 may be higher than the upper tail of the threshold voltage distribution 702.

In one embodiment, after a threshold number of program/erase cycles (e.g., after 10K program/erase cycles), a bit count ratio may be computed in order to determine the number of bits within the zone Zone-2 relative to the number of bits within the zone Zone-1. The bit count ratio may be computed as the number of bits within zone Zone-2 divided by the total number of bits within zones Zone-1 and Zone-2. If the bit count ratio is greater than a threshold ratio (e.g., is greater than 0.2), then the programming voltage for programming memory cells to the particular data state may be reduced by 100 mV or reduced by a voltage amount depending on the bit count ratio itself. The number of bits within zone Zone-1 may be determined by detecting the number of memory cells that were programmed to the particular data state that conduct with a read voltage of Vr1 and don't conduct with a read voltage of Vr2.

Figures 7C, 7D:
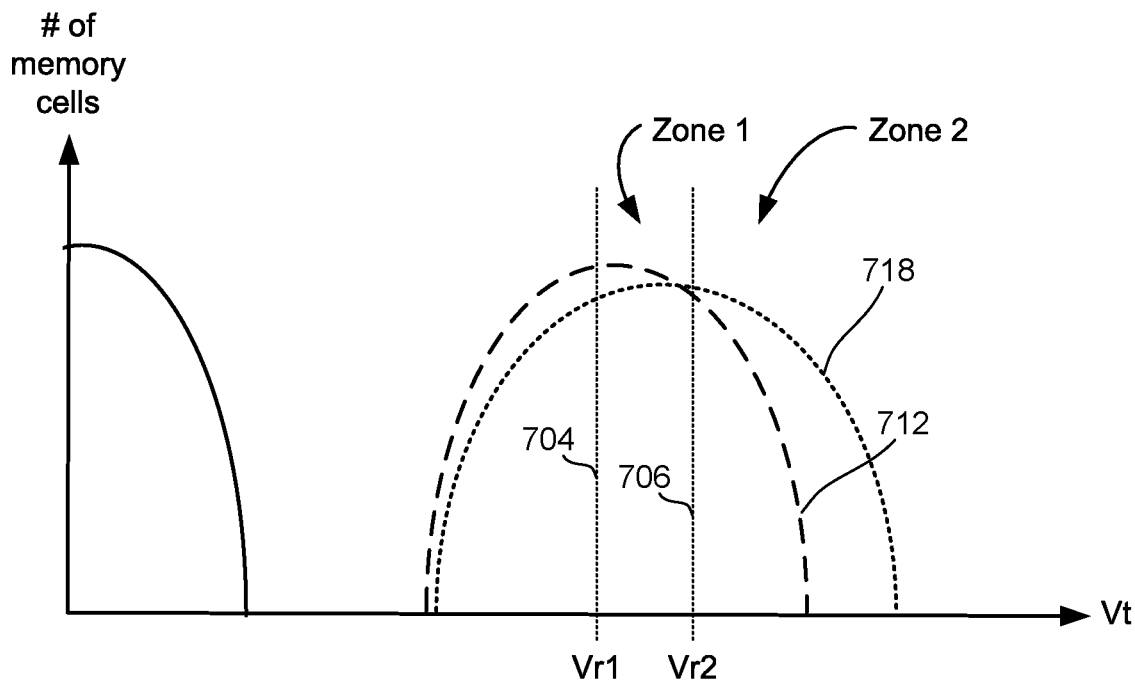
FIG. 7C depicts one embodiment of a threshold voltage distribution for the particular data state depicted in FIG. 7A and the read voltages for identifying two bit counts corresponding with two threshold voltage zones.
FIG. 7D depicts one embodiment of a table for calculating the adjustments to the programming voltage based on a bit count ratio.

FIG. 7C depicts one embodiment of a threshold voltage distribution 718 for the particular data state depicted in FIG. 7A and the read voltages Vr1 704 and Vr2 706 for identifying two bit counts corresponding with two threshold voltage zones Zone-1 and Zone-2. The threshold voltage distribution 718 may correspond with memory cells that have experienced a third number of program/erase cycles greater than the number of program/erase cycles corresponding with the threshold voltage distributions 712 and 702 depicted in FIG. 7B. As a greater number of bits corresponds with zone Zone-2, the amount of reduction in the programming voltage may be increased and/or the frequency at which modulation of the programming voltage occurs may be increased.

FIG. 7D depicts one embodiment of a table for calculating the adjustments to the programming voltage based on a bit count ratio. As depicted, if the bit count ratio comprises 0.02, then the reduction in the programming voltage may comprise 100 mV. If the bit count ratio comprises 0.05, then the reduction in the programming voltage may comprise 200 mV. If the bit count ratio comprises 0.1, then the reduction in the programming voltage may comprise 300 mV. If the bit count ratio comprises 0.15, then the reduction in the programming voltage may comprise 400 mV. If the bit count ratio comprises 0.2, then the reduction in the programming voltage may comprise 500 mV. If the bit count ratio comprises 0.25, then the reduction in the programming voltage may comprise 600 mV. In some cases, for each 0.05 increase in the bit count ratio, the programming voltage may be reduced by 100 mV. The mappings of the bit count ratio (BCR value) to the appropriate programming voltage adjustment (VPGM adjustment) depicted in FIG. 7D may correspond with the appropriate adjustments to be made given a first number of program/erase cycles. The mappings of the bit count ratio to the appropriate programming voltage adjustment may be modified depending on the number of program/erase cycles. For example, after a second number of program/erase cycles greater than the first number of program/erase cycles, the reduction in the programming voltage may be increased by 100 mV. In this case, if the bit count ratio comprises 0.05, then the reduction in the programming voltage may comprise 300 mV and if the bit count ratio comprises 0.1, then the reduction in the programming voltage may comprise 400 mV.

Figure 7E:
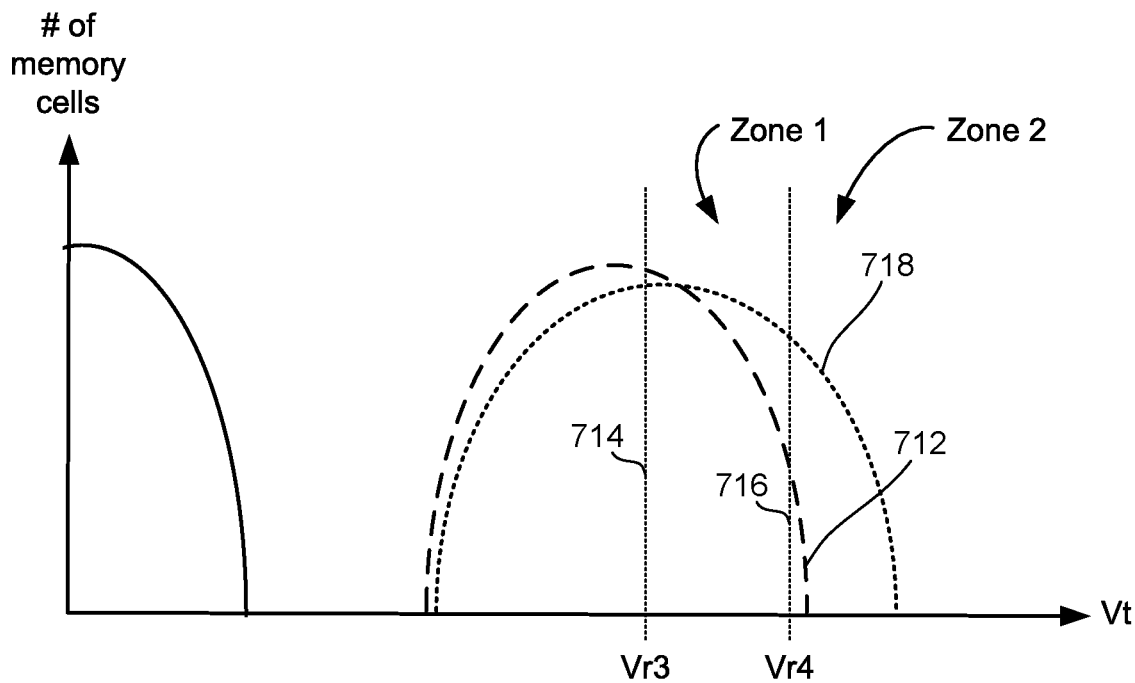
FIG. 7E depicts one embodiment of the threshold voltage distribution for the particular data state depicted in FIG. 7C and the read voltages for identifying two bit counts corresponding with two threshold voltage zones.

FIG. 7E depicts one embodiment of the threshold voltage distribution 718 for the particular data state depicted in FIG. 7C and the read voltages Vr3 714 and Vr4 716 for identifying two bit counts corresponding with two threshold voltage zones Zone-1 and Zone-2. As depicted, the read voltages Vr3 714 and Vr4 716 may correspond with shifted versions of the read voltages Vr1 704 and Vr2 706 depicted in FIG. 7C. In one embodiment, after detecting that a bit count ratio is greater than a threshold ratio (e.g., is greater than 0.1), the read voltages for determining the threshold voltage zones may be adjusted or increased. The increase in the read voltages may depend on the bit count ratio and/or the number of program/erase cycles for a memory block. In one example, in response to detecting that the bit count ratio is greater than 0.1, the read voltage associated with the lower end of zone Zone-1 may be increased by 100 mV. In some cases, in response to detecting that the bit count ratio is greater than 0.1, both the read voltage associated with the lower end of zone Zone-1 and the read voltage associated with the upper end of zone Zone-1 may be increased by 100 mV.

Figure 7F:
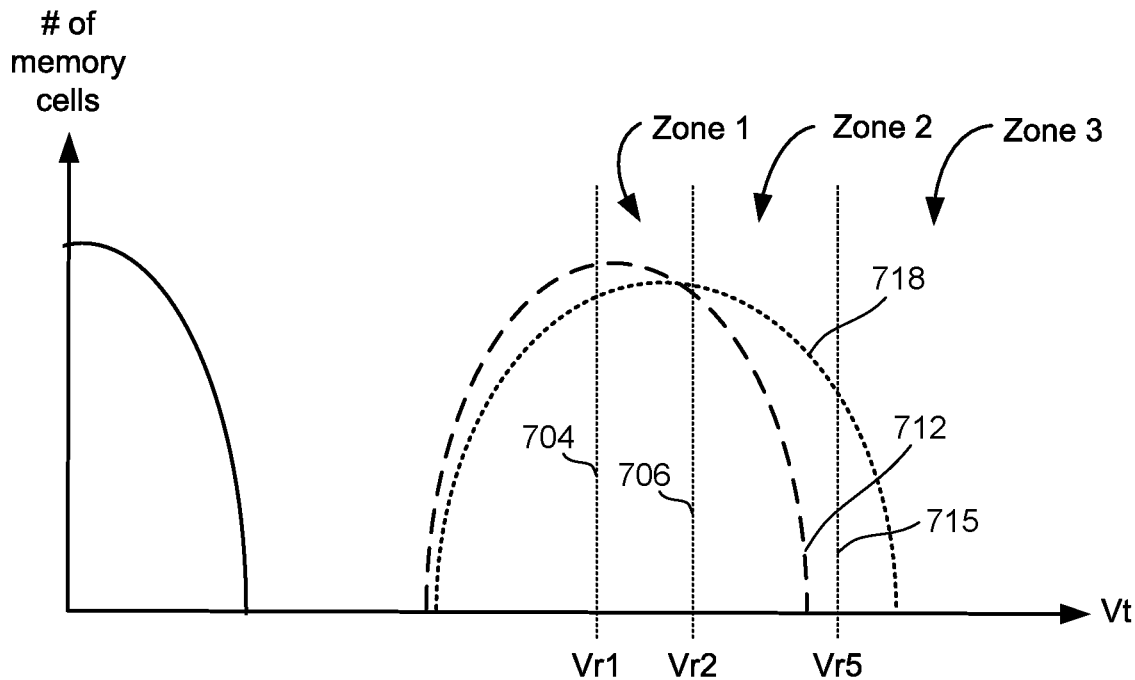
FIG. 7F depicts one embodiment of the threshold voltage distribution for the particular data state depicted in FIG. 7C and read voltages for identifying three bit counts corresponding with three threshold voltage zones Zone-1, Zone-2, and Zone-3.

FIG. 7F depicts one embodiment of the threshold voltage distribution 718 for the particular data state depicted in FIG. 7C and read voltages Vr1 704, Vr2 706, and Vr5 715 for identifying three bit counts corresponding with three threshold voltage zones Zone-1, Zone-2, and Zone-3. In this case, a first bit count ratio may comprise the number of bits within Zone-2 divided by the total number of bits in zones Zone-1 through Zone-3. A second bit count ratio may comprise the number of bits within Zone-3 divided by the total number of bits in zones Zone-1 through Zone-3. In one embodiment, if the second bit count ratio is greater than a threshold ratio (e.g., is greater than 0.1), then the programming voltage for programming memory cells to the particular data state may be reduced by 100 mV. In another embodiment, if the first bit count ratio is not greater than the second bit count ratio by at least two times, then the programming voltage for programming memory cells to the particular data state may be reduced by 200 mV.

In some cases, the bit count for zone Zone-3 may be compared with the bit count for zone Zone-2 and if the bit count for zone Zone-3 is at least 25% of the bit count for zone Zone-2, then the programming voltage (Vpgm) for programming memory cells to the particular data state may be reduced by 100 mV and the read voltage levels for determining zone Zone-2 may be increased by 50 mV. In other cases, the bit count for zone Zone-2 may be compared with the bit count for zone Zone-1 and if the bit count for zone Zone-2 is at least 20% of the bit count for zone Zone-1, then the programming voltage (Vpgm) for programming memory cells to the particular data state may be reduced by 150 mV.

FIG. 7G depicts one embodiment of a table for calculating the programming voltage adjustment based on a bit count ratio and the number of write/erase cycles (or program/erase cycles) experienced by a set of memory cells or a memory block. As depicted, if the bit count ratio comprises 0.02 and the number of write/erase cycles is less than 100K cycles, then the programming voltage reduction comprises 100 mV; however, if the bit count ratio comprises 0.02 and the number of write/erase cycles is between 100K cycles and 200K cycles, then the programming voltage reduction comprises 200 mV. If the bit count ratio comprises 0.1 and the number of write/erase cycles is less than 100K cycles, then the programming voltage reduction comprises 200 mV; however, if the bit count ratio comprises 0.1 and the number of write/erase cycles is between 100K cycles and 200K cycles, then the programming voltage reduction comprises 400 mV. The magnitude of the reduction in programming voltage for a particular data state may depend on the bit count ratio and/or the number of write/erase cycles (WE cycles).

FIG. 7H depicts one embodiment of a table for calculating the programming voltage adjustment interval (or WE interval) based on a bit count ratio. The programming voltage adjustment interval may determine the number of program/erase cycles between calculation of bit count ratios and adjustments to the programming voltage. As depicted, if the bit count ratio comprises 0.02, then the programming voltage adjustment interval comprises 10K cycles. If the bit count ratio comprises 0.05, then the programming voltage adjustment interval comprises 8.5K cycles. If the bit count ratio comprises 0.1, then the programming voltage adjustment interval comprises 7K cycles. If the bit count ratio comprises 0.15, then the programming voltage adjustment interval comprises 5.5K cycles. If the bit count ratio comprises 0.2, then the programming voltage adjustment interval comprises 4K cycles.

In some embodiments, the programming voltage adjustment interval may be determined based on the total number of program/erase cycles that have been experienced by a set of memory cells and the bit count ratio. The set of memory cells may be part of a memory block, such as a NAND memory block. In one example, if the total number of program/erase cycles is less than 100K cycles and the bit count ratio comprises 0.02, then the programming voltage adjustment interval may comprise 10K cycles; however, if the total number of program/erase cycles is greater than 100K cycles and the bit count ratio comprises 0.02, then the programming voltage adjustment interval may comprise 5K cycles.

Figure 8A:
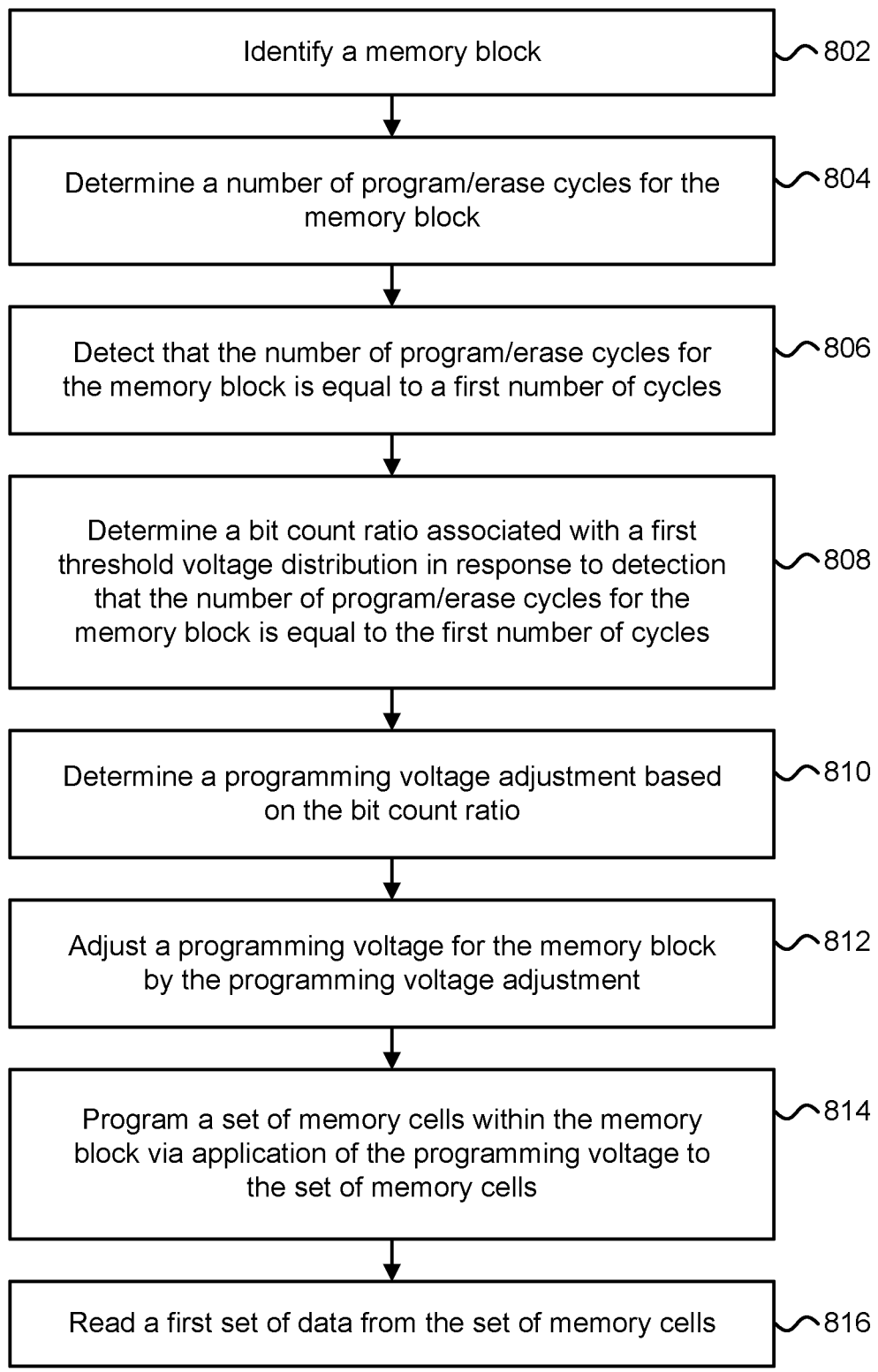
FIG. 8A is a flowchart describing one embodiment of a process for programming memory cells within a memory block.

FIG. 8A is a flowchart describing one embodiment of a process for programming memory cells within a memory block. The memory block may correspond with the memory structure 326 in FIG. 2. In one embodiment, the process of FIG. 8A may be performed by control circuitry, such as control circuitry 310 depicted in FIG. 2. In another embodiment, the process of FIG. 8A may be performed by one or more control circuits, such as controller 120 in FIG. 1.

In step 802, a memory block is identified. The memory block may comprise a NAND memory block. The memory block may comprise one or more NAND strings. In one example, the memory block may correspond with a portion of the memory structure 326 in FIG. 2. In step 804, a number of program/erase cycles for the memory block is determined. The number of program/erase cycles for the memory block may comprise the total number of programming and erase cycles that have been applied to the memory block after fabrication of the memory block. In some cases, a count of the number of erase cycles for the memory block may be stored in a non-volatile memory or lookup table and updated after each erase cycle has been performed on the memory block.

In step 806, it is detected that the number of program/erase cycles for the memory block is equal to or has exceeded a first number of cycles. The first number of cycles may correspond with a threshold number of program/erase cycles after which an update or adjustment to a programming voltage for the memory block should be made. In step 808, a bit count ratio associated with a first threshold voltage distribution is determined in response to detection that the number of program/erase cycles for the memory block is equal to or has exceeded the first number of cycles. The first threshold voltage distribution may correspond with a particular data state (e.g., the B-state). The first threshold voltage distribution may correspond with threshold voltage distribution 702 in FIG. 7A.

In one embodiment, the bit count ratio may be determined by calculating a first number of bits within a first threshold voltage zone and a second number of bits within a second threshold voltage zone. The first threshold voltage zone may comprise a range of threshold voltages between a first read voltage and a second read voltage. The second threshold voltage zones may comprise a range of threshold voltages greater than the second read voltage. In one example, the first threshold voltage zone may correspond with zone Zone-1 in FIG. 7B and the second threshold voltage zone may correspond with zone Zone-2 in FIG. 7B. The first read voltage may correspond with the read voltage Vr1 704 in FIG. 7B and the second read voltage may correspond with the read voltage Vr2 706 in FIG. 7B. The bit count ratio may comprise the second number of bits divided by the sum of the first number of bits within the first threshold voltage zone and the second number of bits within the second threshold voltage zone.

In step 810, a programming voltage adjustment is determined based on the bit count ratio. A lookup table may be used to map a given bit count ratio to a corresponding program voltage adjustment. In one example, the lookup table may correspond with the table depicted in FIG. 7D. In some cases, no adjustment to the programming voltage may be made as long as the bit count ratio is less than 0.02. In step 812, a programming voltage for the memory block is adjusted by the programming voltage adjustment. In one example, the programming voltage for the memory block may be reduced by the programming voltage adjustment. In reference to the table depicted in FIG. 7D, if the bit count ratio comprises 0.1, then the programming voltage for the memory block may be reduced by 300 mV. In step 814, a set of memory cells within the memory block is programmed via application of the programming voltage to the set of memory cells. The programming voltage may be applied to the set of memory cells by biasing a word line connected to the set of memory cells to the programming voltage during a programming operation. In step 816, a first set of data is read from the set of memory cells subsequent to the programming of the set of memory cells in step 814. The first set of data may be stored in a memory buffer.

Figure 8B:
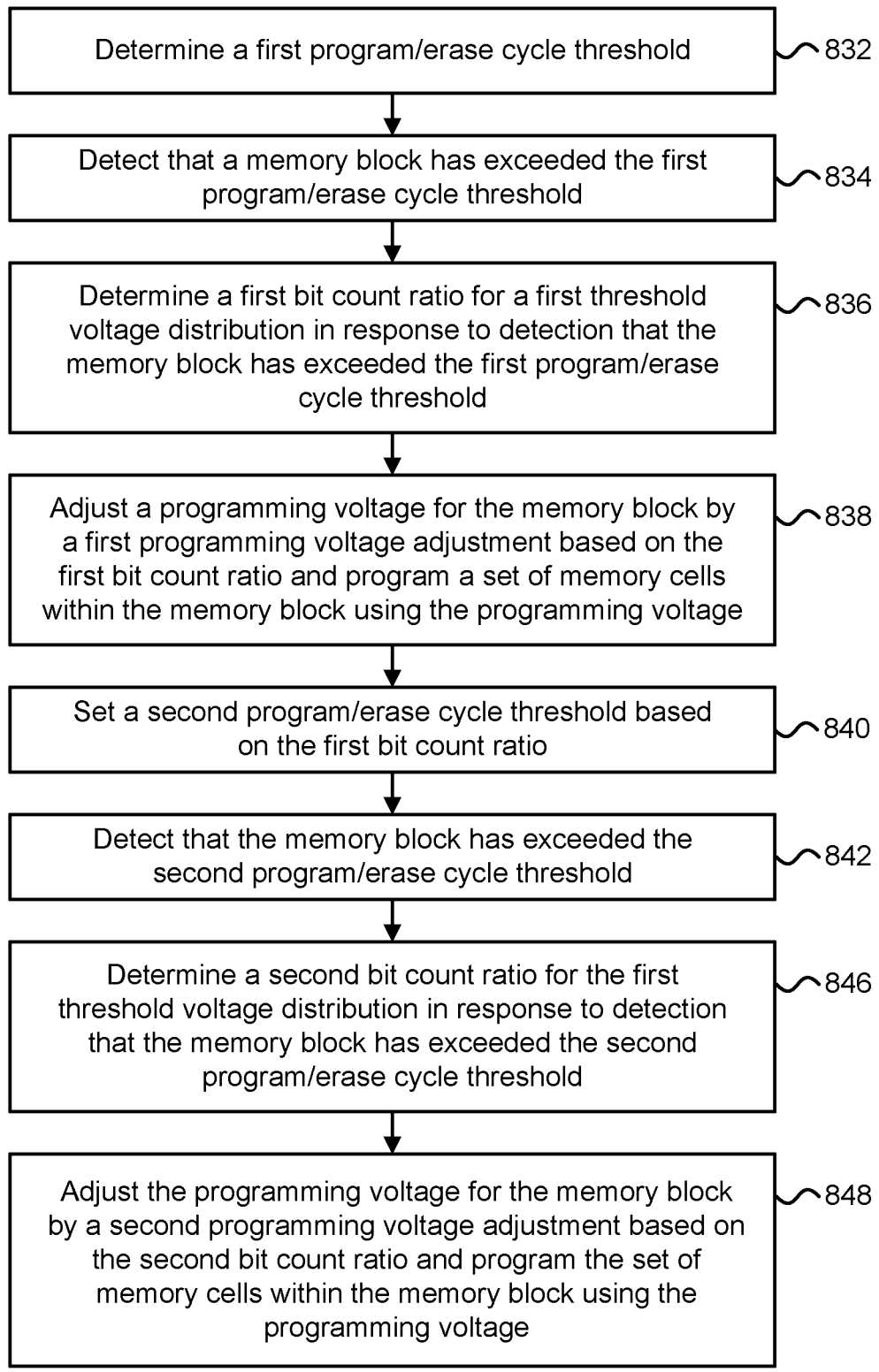
FIG. 8B is a flowchart describing another embodiment of a process for programming memory cells within a memory block.

FIG. 8B is a flowchart describing another embodiment of a process for programming memory cells within a memory block. The memory block may correspond with the memory structure 326 in FIG. 2. In one embodiment, the process of FIG. 8B may be performed by control circuitry, such as control circuitry 310 depicted in FIG. 2. In another embodiment, the process of FIG. 8B may be performed by one or more control circuits, such as controller 120 in FIG. 1.

In step 832, a first program/erase cycle threshold is determined. The first program/erase cycle threshold may correspond with a number of program/erase cycles that must pass before an update to a programming voltage is made. The first program/erase cycle threshold may be acquired via a lookup table. The number of program/erase cycles that must pass before the next update to the programming voltage may be a function of the total number of program/erase cycles that have been experienced by a memory block.

In step 834, it is detected that a memory block has exceeded the first program/erase cycle threshold. In one example, it may be detected that the memory block has undergone or experienced 10K program/erase cycles since the last update was made to the programming voltage.

In step 836, a first bit count ratio for a first threshold voltage distribution is determined in response to detection that the memory block has exceeded the first program/erase cycle threshold. The first threshold voltage distribution may correspond with a particular data state, such as the B-state. The first bit count ratio may correspond with a ratio of the number of bits within a second zone, such as zone Zone-2 in FIG. 7B, to the total number of bits within the second zone and a first zone, such as zone Zone-1 in FIG. 7B.

In one embodiment, in order to determine the first bit count ratio, a first number of memory cells with threshold voltages that are between a first read voltage and the second read voltage greater than the first read voltage may be determined and a second number of memory cells with threshold voltages that are greater than the second read voltage may be determined; the first bit count ratio may comprise the second number divided by the sum of the first number and the second number. As an example, if the second number of memory cells with threshold voltages between 1.7 and 1.9V comprises 100 memory cells and the first number of memory cells with threshold voltages between 1.5V and 1.7V comprises 900 memory cells, then the first bit count ratio will comprise 100/(100+900) or 0.1.

In step 838, a programming voltage for the memory block is adjusted by a first programming voltage adjustment based on the first bit count ratio. The first programming voltage adjustment may be determined using a lookup table, such as the table depicted in FIG. 7D. After the programming voltage has been adjusted, a set of memory cells within the memory block may be programmed using the adjusted programming voltage.

In step 840, a second program/erase cycle threshold is set based on the first bit count ratio. For example, if the first bit count ratio is greater than 0.1, then the second program/erase cycle threshold may be set to 5K cycles; otherwise, if the first bit count ratio is not greater than 0.1, then the second program/erase cycle threshold may be set to 10K cycles. In step 842, it is detected that the memory block has exceeded the second program/erase cycle threshold. It may be detected that the memory block has exceeded 5K program/erase cycles since the last update to the programming voltage. In step 846, a second bit count ratio is determined for the first threshold voltage distribution in response to detection that the memory block has exceeded the second program/erase cycle threshold. The second bit count ratio may be determined similar to the first bit count ratio in which a first number of memory cells with threshold voltages that are between the first read voltage and the second read voltage greater than the first read voltage may be determined and a second number of memory cells with threshold voltages that are greater than the second read voltage may be determined; the second bit count ratio may then comprise the second number divided by the sum of the first number and the second number. Over time as the first threshold voltage distribution corresponding with a particular data state shifts towards higher threshold voltages, the bit count ratio will increase. In one example, the first bit count ratio may comprise 0.1 and the second bit count ratio may comprise 0.2.

In step 848, the programming voltage for the memory block is adjusted by a second programming voltage adjustment based on the second bit count ratio. After the programming voltage has been adjusted by the second programming voltage adjustment, the set of memory cells within the memory block is programmed using the programming voltage. In one embodiment, the first programming voltage adjustment may comprise a reduction in the programming voltage of 200 mV from 14V to 13.8V and the second programming voltage adjustment may comprise a reduction in the programming voltage of 100 mV from 13.8V to 13.7V.

In one embodiment, the update frequency at which the programming voltage is adjusted may depend on the total number of program/erase cycles that the memory block has experienced. For example, if the total number of program/erase cycles exceeds 100K cycles, then the update frequency may correspond with adjustments every 10K cycles; however, if the total number of program/erase cycles is less than 100K cycles, then the update frequency may correspond with adjustments every 20K cycles.

In some embodiments, the threshold voltage ranges corresponding with the two zones for computing the bit count ratio may be adjusted depending on the total number of program/erase cycles that the memory block has experience. For example, if the total number of program/erase cycles exceeds 100K cycles, then the read voltages for determining the first zone may comprise 1.5V and 1.7V; however, if the total number of program/erase cycles is less than 100K cycles, then the read voltages for determining the first zone may comprise 1.4V and 1.6V.

Figure 8C:
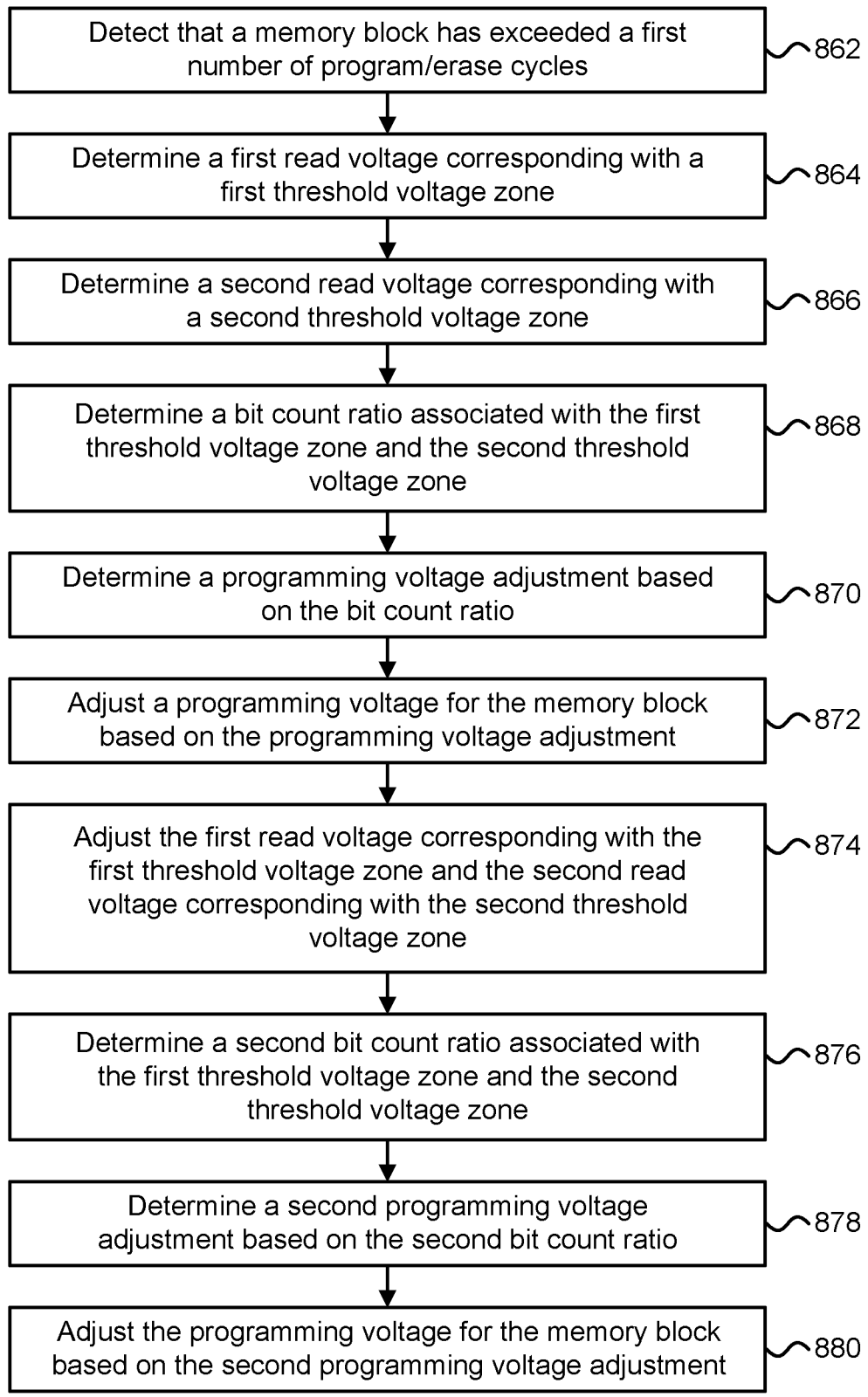
FIG. 8C is a flowchart describing an alternative embodiment of a process for programming memory cells within a memory block.

FIG. 8C is a flowchart describing an alternative embodiment of a process for programming memory cells within a memory block. The memory block may correspond with the memory structure 326 in FIG. 2. In one embodiment, the process of FIG. 8C may be performed by control circuitry, such as control circuitry 310 depicted in FIG. 2. In another embodiment, the process of FIG. 8C may be performed by one or more control circuits, such as controller 120 in FIG. 1.

In step 862, it is detected that a memory block has exceeded a first number of program/erase cycles. The memory block may comprise a plurality of NAND strings. In step 864, a first read voltage corresponding with a first threshold voltage zone is determined. In step 866, a second read voltage corresponding with a second threshold voltage zones is determined. The first read voltage and the second read voltage may be determined via a lookup table for determining the threshold voltage ranges corresponding with two zones for calculating a bit count ratio. In step 860, a bit count ratio associated with the first threshold voltage zone and the second threshold voltage zones is determined. The first threshold voltage zone may correspond with zone Zone-1 in FIG. 7B and the second threshold voltage zone may correspond with zone Zone-2 in FIG. 7B.

In step 870, a programming voltage adjustment is determined based on the bit count ratio. The programming voltage adjustment may be determined via a lookup table, such as the table depicted in FIG. 7D. For example, if the bit count ratio comprises 0.15, then the programming voltage adjustment may comprise a reduction in the programming voltage by 400 mV. In step 872, a programming voltage for the memory block is adjusted based on the programming voltage adjustment. In step 874, the first read voltage corresponding with the first threshold voltage zone and the second read voltage corresponding with the second threshold voltage zone are adjusted. In one embodiment, the first read voltage and the second read voltage may be adjusted depending on a total number of program/erase cycles that have been experienced by the memory block. In another embodiment, the first read voltage and the second read voltage may be adjusted depending on the bit count ratio. For example, if the bit count ratio is greater than 0.2, then the first read voltage and the second read voltage may be increased by 50 mV; otherwise, the first read voltage and the second read voltage may be left unmodified.

In step 876, a second bit count ratio associated with the first threshold voltage zone and the second threshold voltage zones is determined. In step 878, a second programming voltage adjustment is determined based on the second bit count ratio. The bit count ratio determined in step 860 may correspond with the bit count ratio for zones Zone-1 and Zone-2 in FIG. 7C with read voltages Vr1 and Vr2. The second bit count ratio determined in step 876 may correspond with the bit count ratio for zones Zone-1 and Zone-2 in FIG. 7D with read voltages Vr3 and Vr4. As the threshold voltage distribution for a particular data state shifts higher as the number of program/erase cycles increases, the read voltages used for calculating the bit count ratios may be increased. In step 880, the programming voltage for the memory block is adjusted based on the second programming voltage adjustment. The second programming voltage adjustment may be determined via a lookup table, such as the table depicted in FIG. 7D. After the second programming voltage adjustment has been made to the programming voltage, the programming voltage may be applied to a set of memory cells within the memory block.

One embodiment of the disclosed technology includes a memory block and one or more control circuits in communication with the memory block. The memory block including a set of memory cells. The one or more control circuits configured to determine a number of program/erase cycles experienced by the memory block and detect that the number of program/erase cycles experienced by the memory block has exceeded a first number of cycles. The one or more control circuits configured to determine a bit count ratio associated with a first data state distribution in response to detection that the number of program/erase cycles experienced by the memory block has exceeded the first number of cycles. The one or more control circuits configured to determine a programming voltage adjustment based on the bit count ratio and adjust a programming voltage for the memory block by the programming voltage adjustment. The one or more control circuits configured to program a set of memory cells within the memory block using the adjusted programming voltage.

One embodiment of the disclosed technology includes determining a first program/erase cycle threshold based on a total number of program/erase cycles for a memory block, detecting that the memory block has exceeded the first program/erase cycle threshold, determining a first bit count ratio for a first threshold voltage distribution in response to detection that the memory block has exceeded the first program/erase cycle threshold, determining a first programming voltage adjustment for a programming voltage to be applied to a set of memory cells within the memory block based on the first bit count ratio and the total number of program/erase cycles for the memory block, reducing the programming voltage by the first programming voltage adjustment, and programming the set of memory cells within the memory block using the reduced programming voltage.

One embodiment of the disclosed technology includes a memory block and one or more control circuits in communication with the memory block. The memory block including a plurality of memory cells. The one or more control circuits configured to determine a first read voltage corresponding with a first threshold voltage zone and determine a second read voltage corresponding with a second threshold voltage zone. The one or more control circuits configured to determine a bit count ratio associated with the first threshold voltage zone and the second threshold voltage zone and determine a programming voltage adjustment based on the bit count ratio. The one or more control circuits configured to reduce a programming voltage for the plurality of memory cells by the programming voltage adjustment prior to programming the plurality of memory cells using the reduced programming voltage.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

Two devices may be "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
  a memory array including a set of memory cells; and
  one or more control circuits in communication with the memory array, the one or more control circuits configured to determine a number of program/erase cycles experienced by the memory array and detect that the number of program/erase cycles experienced by the memory array has exceeded a first number of cycles, the one or more control circuits configured to determine a bit count ratio associated with a first data state distribution in response to detection that the number of program/erase cycles experienced by the memory array has exceeded the first number of cycles, the one or more control circuits configured to determine a programming voltage adjustment based on the bit count ratio and adjust a programming voltage for the memory array by the programming voltage adjustment, the one or more control circuits configured to program a set of memory cells within the memory array using the adjusted programming voltage.

2. The apparatus of claim 1, wherein:
the one or more control circuits configured to determine the first number of cycles based on a total number of program/erase cycles experienced by the memory array.

3. The apparatus of claim 1, wherein:
the one or more control circuits configured to determine a first bit count associated with a first zone of the first data state distribution and a second bit count associated with a second zone of the first data state distribution.

4. The apparatus of claim 3, wherein:
the one or more control circuits configured to determine the bit count ratio based on the first bit count and the second bit count.

5. The apparatus of claim 3, wherein:
the one or more control circuits configured to calculate the bit count ratio as the second bit count divided by the sum of the first bit count and the second bit count.

6. The apparatus of claim 3, wherein:
the one or more control circuits configured to determine the first bit count using two verify levels; and
the first bit count corresponds with a subset of the set of memory cells with threshold voltages between the two verify levels.

7. The apparatus of claim 1, wherein:
the one or more control circuits configured to determine the bit count ratio using three threshold voltage zones.

8. The apparatus of claim 1, wherein:
the one or more control circuits configured to program the set of memory cells within the memory array via application of the adjusted programming voltage to the set of memory cells.

9. The apparatus of claim 1, wherein:
the one or more control circuits configured to program the set of memory cells within the memory array via application of the adjusted programming voltage to a word line connected to the set of memory cells.

10. The apparatus of claim 1, wherein:
the set of memory cells comprises a set of charge trap transistors; and
the memory array comprises a three dimensional memory array with vertical bit lines.

11. A method, comprising:
determining a first program/erase cycle threshold based on a total number of program/erase cycles for a memory block;
detecting that the memory block has exceeded the first program/erase cycle threshold;
determining a first bit count ratio for a first threshold voltage distribution in response to detection that the memory block has exceeded the first program/erase cycle threshold;
determining a first programming voltage adjustment for a programming voltage to be applied to a set of memory cells within the memory block based on the first bit count ratio and the total number of program/erase cycles for the memory block;
reducing the programming voltage by the first programming voltage adjustment; and
programming the set of memory cells within the memory block using the reduced programming voltage.

12. The method of claim 11, further comprising:
determining a second program/erase cycle threshold different from the first program/erase cycle threshold based on the first bit count ratio;
detecting that the memory block has exceeded the second program/erase cycle threshold;
determining a second bit count ratio for the first threshold voltage distribution in response to detection that the memory block has exceeded the second program/erase cycle threshold; and
adjusting the programming voltage for the memory block by a second programming voltage adjustment based on the second bit count ratio.

13. The method of claim 12, wherein:
the second program/erase cycle threshold is less than the first program/erase cycle threshold.

14. The method of claim 13, wherein:
the second program/erase cycle threshold comprises 5K cycles and the first program/erase cycle threshold comprises 10K cycles.

15. The method of claim 11, wherein:
the determining the first bit count ratio includes determining a first bit count for a first threshold voltage zone, determining a second bit count for a second threshold voltage zone, and determining the first bit count ratio based on the first bit count and the second bit count.

16. The method of claim 15, wherein:
the first bit count ratio comprises the second bit count divided by the sum of the first bit count and the second bit count.

17. An apparatus, comprising:
a memory block including a plurality of memory cells; and
one or more control circuits in communication with the memory block, the one or more control circuits configured to determine a first read voltage corresponding with a first threshold voltage zone and determine a second read voltage corresponding with a second threshold voltage zone, the one or more control circuits configured to determine a bit count ratio associated with the first threshold voltage zone and the second threshold voltage zone and determine a programming voltage adjustment based on the bit count ratio, the one or more control circuits configured to reduce a programming voltage for the plurality of memory cells by the programming voltage adjustment prior to programming the plurality of memory cells using the reduced programming voltage.

18. The apparatus of claim 17, wherein:
the one or more control circuits configured to adjust the first read voltage corresponding with the first threshold voltage zone based on the bit count ratio.

19. The apparatus of claim 17, wherein:
the one or more control circuits configured to adjust the first read voltage corresponding with the first threshold voltage zone based on a total number of program/erase cycles for the memory block.

20. The apparatus of claim 17, wherein:
the plurality of memory cells comprises floating gate transistors.

* * * * *